US006803634B2

(12) United States Patent
Okuno et al.

(10) Patent No.: US 6,803,634 B2
(45) Date of Patent: Oct. 12, 2004

(54) STABILIZATION IN DEVICE CHARACTERISTICS OF A BIPOLAR TRANSISTOR THAT IS INCLUDED IN A SEMICONDUCTOR DEVICE WITH A CMOSFET

(75) Inventors: Takuya Okuno, Nukata-gun (JP); Shoji Mizuno, Okazaki (JP); Toshitaka Kanemaru, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/289,220

(22) Filed: Nov. 7, 2002

(65) Prior Publication Data

US 2003/0085414 A1 May 8, 2003

(30) Foreign Application Priority Data

Nov. 7, 2001 (JP) ....................................... 2001-341906

(51) Int. Cl.$^7$ ................................................ H01L 29/76

(52) U.S. Cl. ....................... 257/378; 257/133; 257/205; 257/273; 257/337; 257/350; 257/370; 257/511; 438/135; 438/202; 438/205; 438/234; 438/309

(58) Field of Search ................................ 438/135, 202, 438/205, 309, 234; 257/133–146, 195, 205, 273, 337, 341, 343, 350, 361, 362, 370, 378, 511, 512, 514, 517, 518, 525, 526, 539–543, 552–569, 574–576

(56) References Cited

U.S. PATENT DOCUMENTS 5,059,549 A * 10/1991 Furuhata ..................... 438/234
5,340,756 A * 8/1994 Nagayasu ................... 438/200
6,156,595 A * 12/2000 Sawada ...................... 438/202
6,352,887 B1 * 3/2002 Hutter et al. ............... 438/202
6,365,932 B1 4/2002 Kouno et al.
6,492,211 B1 * 12/2002 Divakaruni et al. ........ 438/155

FOREIGN PATENT DOCUMENTS

| | | | | |
|---|---|---|---|---|
| EP | 0948046 | | 10/1999 | |
| EP | 948046 a1 | * | 10/1999 | ....... H01L/21/8249 |
| JP | A-60-144962 | | 7/1985 | |
| JP | A-2-100339 | | 4/1990 | |

OTHER PUBLICATIONS

Terashima, Tomohide; Yamamoto, Fumitoshi; Hatasako, Kenichi; and Hine, Shiro; "Development of a 0.5$\mu$m BiC-MOS and DMOS process," EDD–99–108, Spe.–99–88. pp. 87–92.

* cited by examiner

*Primary Examiner*—David Nelms
*Assistant Examiner*—Andy Huynh
(74) *Attorney, Agent, or Firm*—Posz & Bethards, PLC

(57) ABSTRACT

In the manufacturing process of a Bi-CMOS semiconductor device, which includes a CMOSFET and a bipolar transistor, the steps for forming a well region, source regions, and drain regions of the CMOSFET are also used for forming the bipolar transistor. One of the steps is used for introducing impurities of the same conductivity type in a surface of a base region of the bipolar transistor in order to form a high impurity concentration region in the surface. The high impurity concentration region is formed such that the distance between an emitter region of the bipolar transistor and the high impurity concentration region becomes 1 to 2 $\mu$m. The shift in device characteristics of the bipolar transistor is improved by the high impurity concentration region even if the impurity concentration is relatively low at the surface of the base region of the bipolar transistor.

16 Claims, 24 Drawing Sheets

FIG. 8A
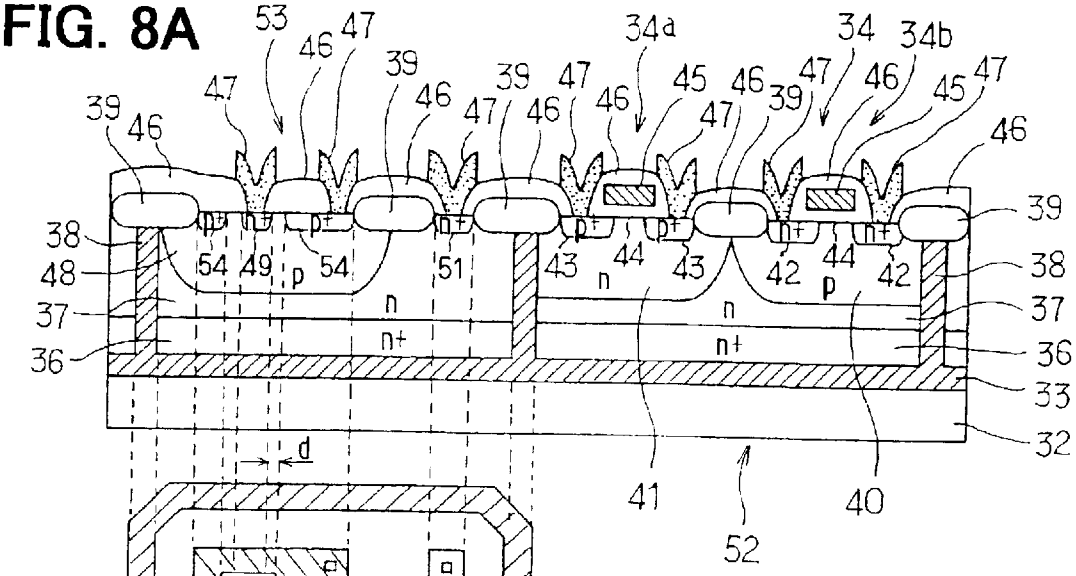
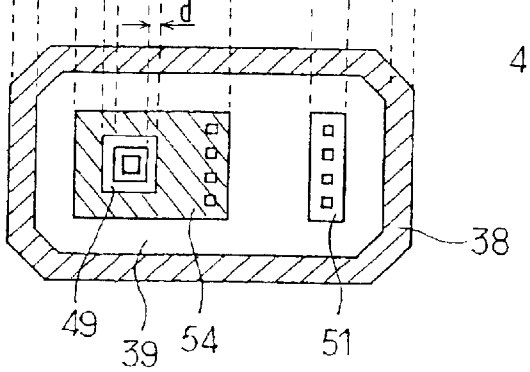
FIG. 8B
FIG. 8C
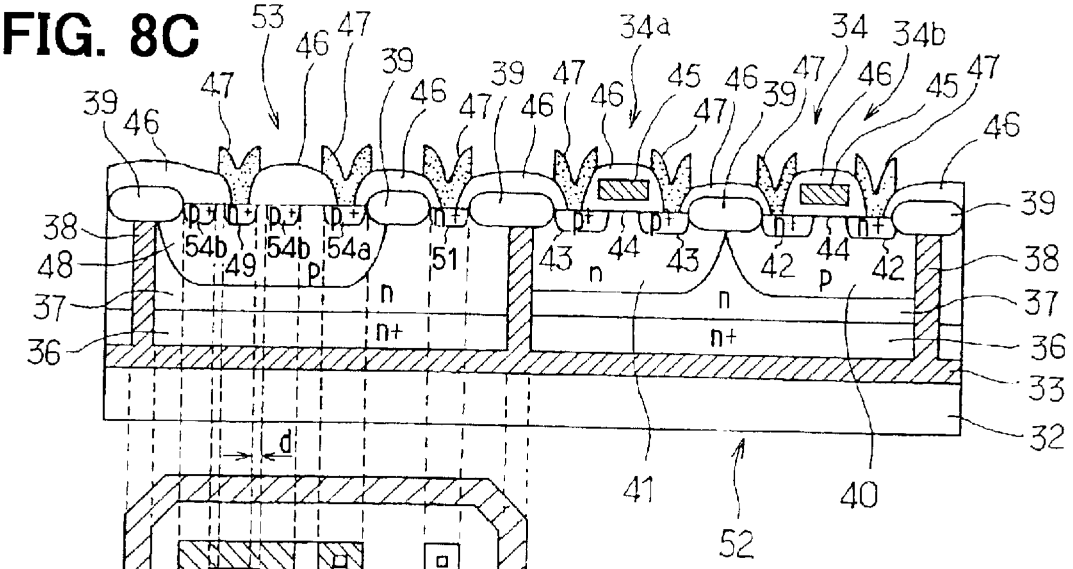
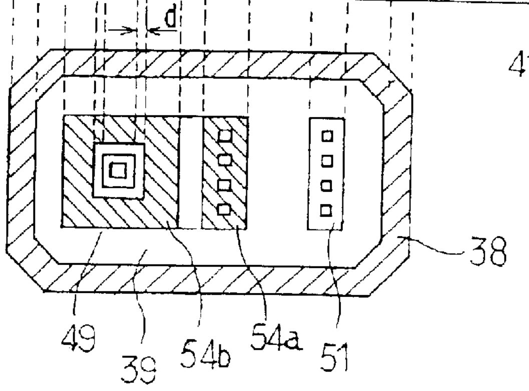
FIG. 8D

STABILIZATION IN DEVICE CHARACTERISTICS OF A BIPOLAR TRANSISTOR THAT IS INCLUDED IN A SEMICONDUCTOR DEVICE WITH A CMOSFET

CROSS REFERENCE TO RELATED APPLICATION

This application is based on and incorporates herein by reference Japanese Patent Application No. 2001–341906 filed on Nov. 7, 2001.

BACKGROUND OF THE INVENTION

The present invention relates to a semiconductor device including a CMOSFET and a bipolar transistor and to a method for manufacturing the semiconductor device. In the method, the bipolar transistor is formed by taking advantage of steps for forming a well region, source regions, and drain regions of the CMOSFET.

With a manufacturing process for a semiconductor device called a Bi-CMOS IC, in which bipolar transistors and CMOSFETs are formed on the same substrate, there is a technology for forming, for example, base regions of the bipolar transistors using diffusion regions for forming wells for the CMOSFETs and for forming emitter regions using diffusion regions for forming the source and drain regions in order to reduce the number of process steps. In a semiconductor device 1 shown in FIG. 24, a silicon-on-insulator (SOI) substrate is included, and a CMOSFET 4 and a bipolar transistor 5 are located over an insulating film 3 on a silicon substrate 2.

An SOI layer included in the SOI substrate includes a high impurity concentration n-type silicon layer 6 and a low impurity concentration n-type silicon layer 7 on the insulating film 3, and the transistors 4, 5 of the device 1 are isolated by trenches 8 and by LOCOS 9 in a surface of the device 1. The CMOSFET 4 includes p channel-type and n channel-type MOSFETs 4*a*, 4*b*, in which an n-type well 10 and a p-type well 11 are included, respectively. Source and drain regions 12, 13 are included in the n-type well 10 and the p-type well 11, respectively. Each gate electrode 15 is located on a gate oxide film 14. Contact holes are located in an insulating film 16. Aluminum electrodes 17 are in electric contact with the source and drain regions 12, 13.

An npn transistor 5 includes a low impurity concentration n-type silicon layer 7 as a collector region, in a surface of which a p-type base region 18 is located. An n-type emitter region 19 and a base contact region 20 are located in a surface of the p-type base region 18. A collector contact region 21 is also located in the surface of the silicon layer 7.

The semiconductor device 1 is formed by the following process flow, which is shown in FIGS. 25A to 25G. As shown in FIG. 25A, an SOI substrate 210, in which n-type single crystal silicon layers 6, 7 are located on an insulating layer 3, is prepared. Then, trenches 8 are formed outside the areas where for transistors 4, 5 are formed, as shown in FIG. 25B. Then, wells 10, 11 are formed using a known CMOSFET process. Simultaneously, base region 18 is formed, as shown in FIG. 25C. Next, as shown in FIG. 25D, LOCOS 9 are formed, and a gate oxide film 14 and gate electrodes 15 are formed, as shown in FIG. 25F.

Using the gate electrodes 15 as a mask, the source and drain regions 12, 13 of MOSFETs 4*a*, 4*b* are formed, as shown FIG. 25F. Simultaneously, an emitter region 19, a base contact region 20, and a collector contact region 21 are formed. Finally, an insulating film 16 and the aluminum electrodes 17 are formed to complete a Bi-CMOSFET semiconductor device 1.

Because the npn transistor 5 is formed using a CMOSFET manufacturing process, the Bi-CMOSFET semiconductor device 1 has the following drawback with the characteristics of the npn transistor 5. The base region 18 of the transistor 5 is simultaneously formed at the step for forming the p-type well 11, so the surface impurity concentration of the base region 18 is generally relatively low. Therefore, the characteristics of the transistor 5 can shift due to a slight shift in the amount of charges at the interface between the p-type base region 18 and the insulating film 16, which is made of $SiO_2$, under a certain biasing condition for driving the transistor 5. The interface is shown with small x-marks in FIG. 24. As a result, the characteristics of the transistor 5 become unstable, and operating errors are caused in some circuit designs.

SUMMARY OF THE INVENTION

The present invention has been made in view of the above aspects. A first object of the present invention is to provide a semiconductor device that is relatively stable in the device characteristics, which are affected by the impurity concentration at a surface of a base region, even when a bipolar transistor and a CMOSFET is simultaneously formed in a device using a CMOSFET process. A second object is to provide a method of manufacturing the semiconductor device.

In the present invention, a CMOSFET and a bipolar transistor are formed into a single unit on a substrate. The steps for forming a well region, source regions, and drain regions of the CMOSFETs are also used for forming the bipolar transistors, and one of the steps is used for introducing impurities of the same conductivity type in a surface of a base region of the bipolar transistor in order to form a high impurity concentration area in the surface.

Alternatively, the surface of the base region is exposed by ultraviolet rays in order to reduce the amount of charges at the interface between the base region and an insulating film located on the surface of the base region.

Alternatively, after an insulating film is formed at the surface of the base region of the bipolar transistor, a hydrogen barrier film is formed such that the hydrogen barrier film covers the surface of the base region.

BRIEF DESCRIPTION OF THE DRAWINGS

The above and other objects, features and advantages of the present invention will become more apparent from the following detailed description made with reference to the accompanying drawings. In the drawings:

FIG. 8A is a partial cross-sectional view of a first variation of a semiconductor device according to a second embodiment, FIG. 8B is a plan view of a bipolar transistor in the first variation, FIG. 8C is a partial cross-sectional view of a second variation of the semiconductor device according to the second embodiment, FIG. 8D is a plan view of a bipolar transistor in the second variation;

DETAILED DESCRIPTION OF THE PREFERRED EMBODIMENTS

The present invention will be described in detail with reference to various embodiments.

First Embodiment

Figure 1:
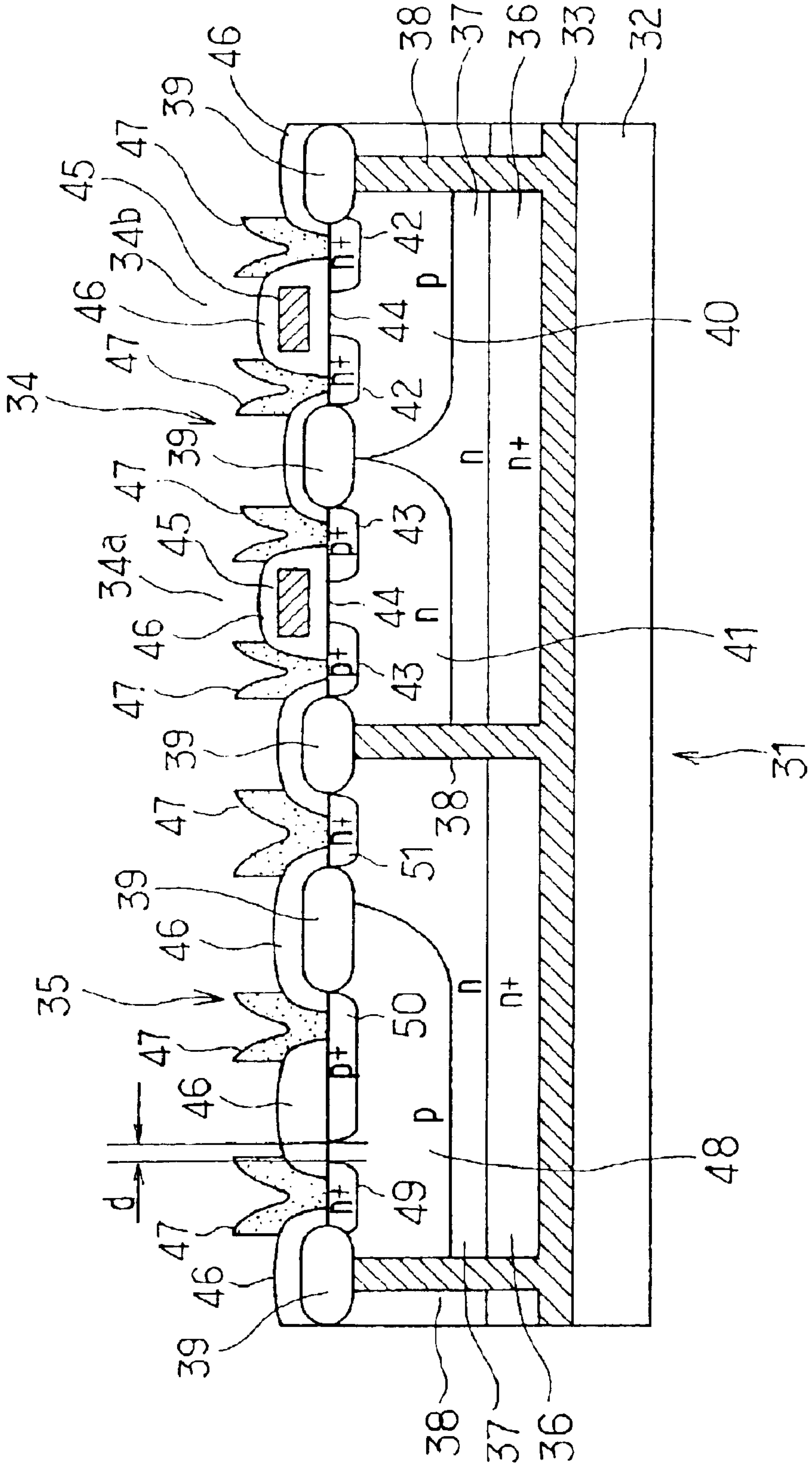
FIG. 1 is a partial cross-sectional view of a semiconductor device according to a first embodiment of the present invention.

As shown in FIG. 1, a Bi-CMOS semiconductor device 31 includes a CMOSFET 34 and a bipolar transistor 35. The CMOSFET 34 and the transistor 35 are located on an insulating film 33, which is located on a silicon substrate 32.

The Bi-CMOS semiconductor device 31 is formed from an SOI substrate, which has an SOI layer including a high impurity concentration n-type silicon layer 36 and a low impurity concentration n-type silicon layer 37, impurity concentration of which is, for example, approximately $1\times10^{15}$ $cm^{-3}$. The CMOSFET 34 and the transistor 35 include the silicon layers 36 and 37. The CMOSFET 34 and the bipolar transistor 35 are surrounded and isolated by the trenches 38, respectively. Furthermore, the CMOSFET 34 and the bipolar transistor 35 are isolated by local-oxidation-of-silicon (LOCOS) areas 39 at the surface of the device 31. The CMOSFET 34 includes an n channel MOSFET **34*a* and a p channel MOSFET 34*b*. A p-type well 40, which has an impurity concentration of, for example, approximately $4\times10^{16}$ $cm^{-3}$, and an n-type well 41 are located in the low impurity concentration n-type layer 37. N-type source and drain regions 42 are located in the p-type well 40. P-type source and drain regions 43 are located in the n-type well 41**.

Gate electrodes 45 are made of polycrystalline silicon. Each gate electrode 45 is located on a gate insulating film 44, which is located above each channel between the source region and the drain region 42, 43. The surface of the CMOSFET 34 is covered by an insulating film 46, and aluminum electrodes 47 are in electric contact with the source and drain regions 42, 43 through contact holes in the insulating film 46.

In the bipolar transistor 35, a p-type base region 48, which has an impurity concentration of, for example, approximately $4\times10^{16}$ $cm^{-3}$, is located in a surface of the low impurity concentration n-type layer 37. A high impurity concentration n-type emitter region 49, which has an impurity concentration of, for example, approximately $1\times10^{20}$ $cm^{-3}$, is located in a surface of the p-type base region 48. In addition, a high impurity concentration p-type base region 50, which has an impurity concentration of, for example, approximately $1\times10^{20}$ $cm^{-3}$, is located in the surface of the p-type base region 48. The high impurity concentration p-type base region 50 is extends from an end of the LOCOS 39 to a position having a distance d from an end of the emitter region 49. A high impurity concentration n-type collector contact region 51 is located in a surface of the low impurity concentration n-type layer 37. The surface of the bipolar transistor 35 is also covered by an insulating film 46, and aluminum electrodes 47 are in electric contact with the emitter region 49, the base region 50, and the collector contact region 51 through contact holes in the insulating film 46.

In the Bi-CMOS semiconductor device 31, the base region 48 of the bipolar transistor 35 is simultaneously formed when the p-type well 41 of the CMOSFET 34 is formed. Furthermore, the emitter region 49 and the collector contact region 51 are simultaneously formed when the n-type source and drain regions 42 are formed. The high impurity concentration p-type base region 50 is simultaneously formed when the p-type source and drain regions 43 are formed.

In the Bi-CMOS semiconductor device 31, the impurity concentration of the p-type well 40 is lower than the concentration required for the base of a bipolar transistor. The impurity concentration is, for example, approximately $4\times10^{16}$ $cm^{-3}$. Therefore, it is essentially undesired that the base region 48 is formed at the step of forming the p-type well 40 in terms of device characteristics. However, the surface area of the base region 48 is mostly covered by the emitter region 49 and the high impurity concentration p-type base region 50, and the base region 48 is in contact with the insulating film 46 at the space of as short as 1 to 2 μm between the emitter region 49 and the base region 50. Therefore, the instability in operating characteristics of the bipolar transistor 35, which is caused by a relatively low impurity concentration at the surface of the base region 48, is improved, and the operating characteristics becomes relatively stable. The reason is as follows.

Figure 24:
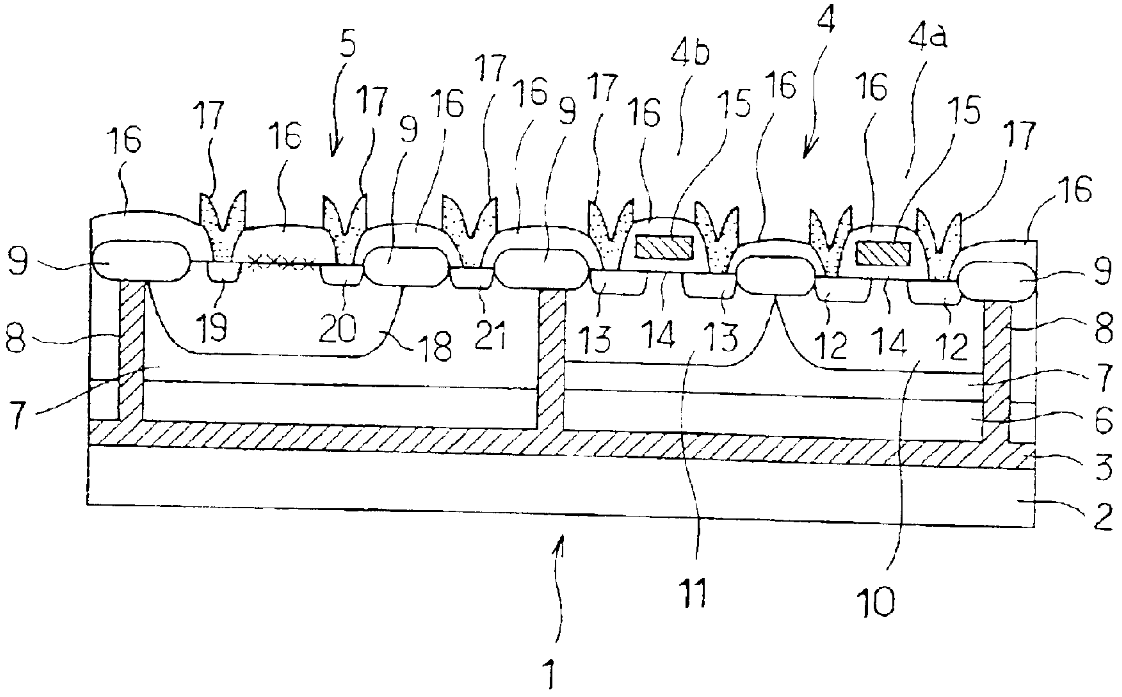
FIG. 24 is a cross-sectional view of a proposed semiconductor device.
Figure 25A:
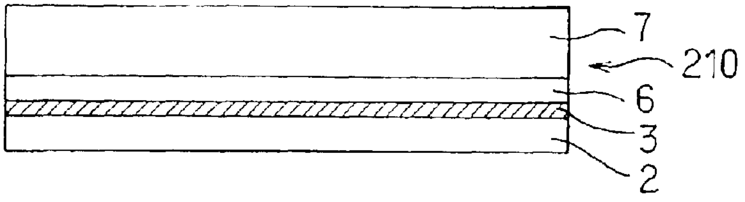
FIGS. 25A to 25G are cross-sectional views showing the structure of the device in FIG. 24 in the manufacturing process of the device.
Figure 25B:
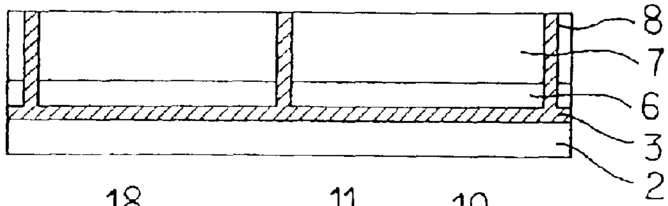
Figure 25C:
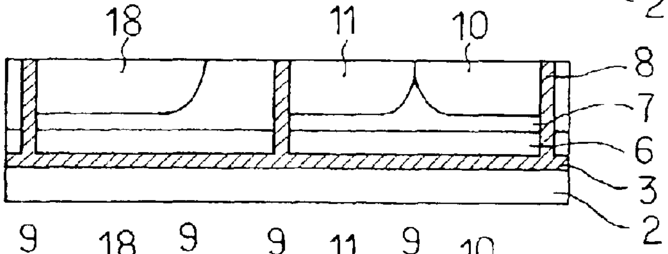
Figure 25D:
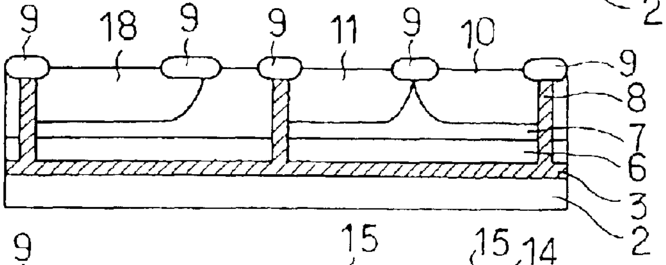
Figure 25E:
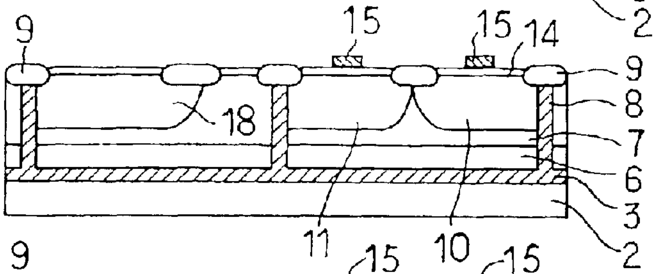
Figure 25F:
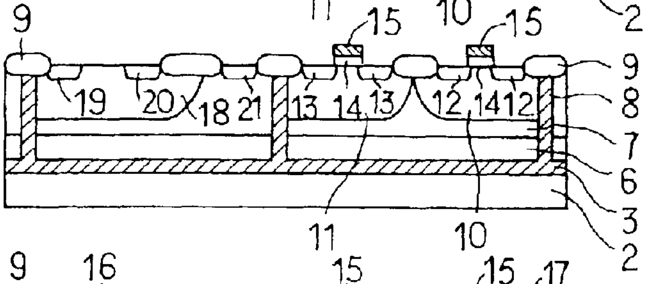
Figure 25G:
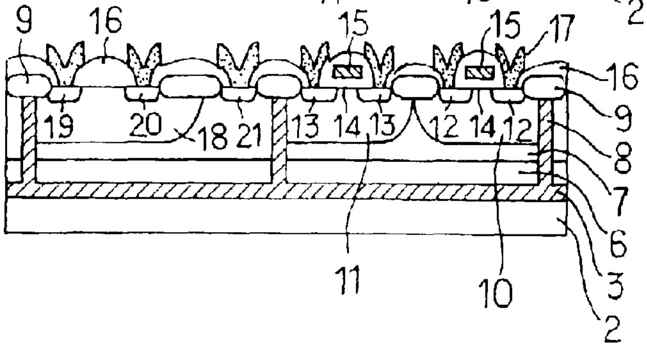

In the Bi-CMOSFET semiconductor device 1 of FIG. 24, the impurity concentration at the surface of the base region 18 can be as low as $1\times10^{18}$ $cm^{-3}$ or less for the sake of the design of the CMOSFET 4 when simultaneously forming the base region 18 of the bipolar transistor 5 and the p-type well region 11 of the CMOSFET 4. In that case, the operating characteristics stray from desired values, because an n-type inversion layer can be formed at the surface of the base region 18 when the bipolar transistor 5 is driven under certain biasing conditions, or when an amount of the positive fixed charges increases at the Si—$SiO_2$ interface, which is located between the base contact region 20 and the emitter region 19, in the manufacturing process of the device 1.

Figure 2:
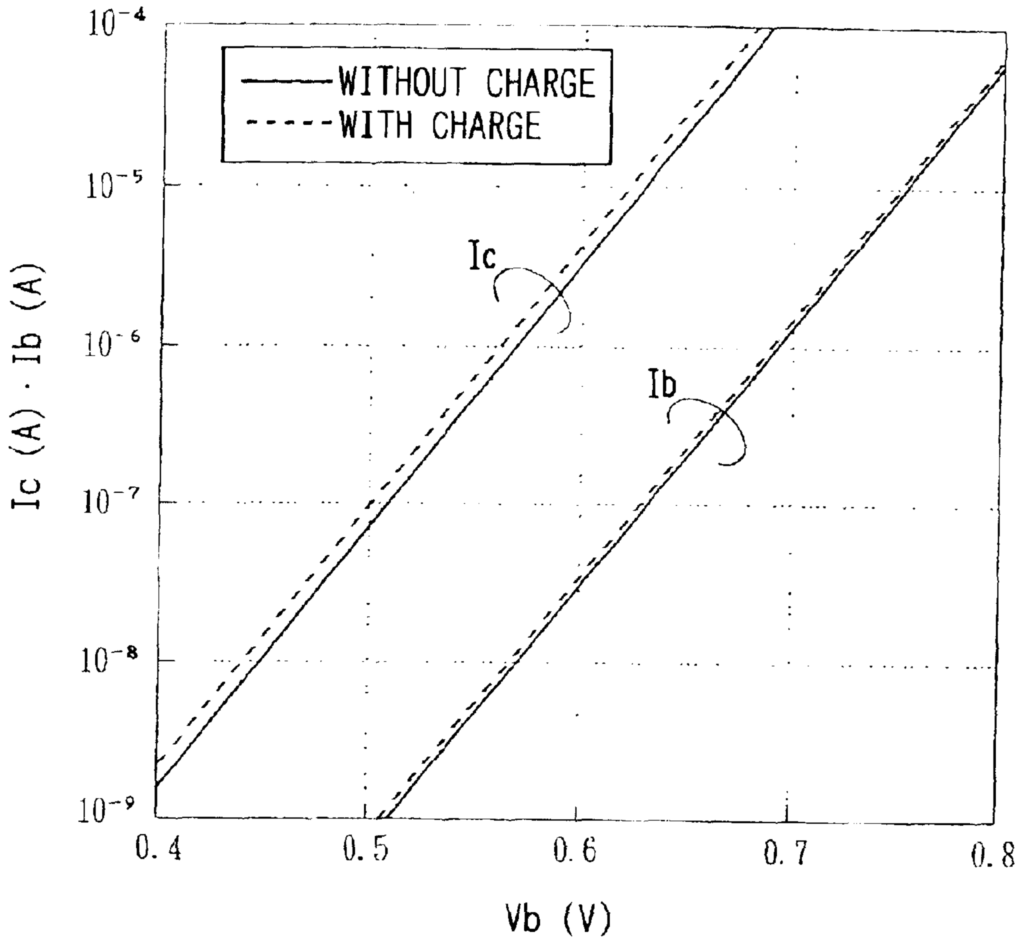
FIG. 2 is a graph showing the simulation results obtained for the Gummel characteristics of an npn transistor having a surface impurity concentration of $2\times10^{16}$ $cm^{-3}$ in a base region of the transistor in both cases with and without positive fixed charges at an interface between a base region and an insulating film located on the base region.

The inventor of the present invention conducted the following simulations to study the above problem. As shown in FIG. 2, the collector currents increase due to the positive fixed charges. The direct current gain $h_{FE}$ is expressed in the equation, $h_{FE}$=Ic/Ib, where Ib is a base current, and Ic is a collector current. In general, the base current Ib increases when the number of recombination sites increases due to a higher density of defects such as a crystal defect and a dangling bond in the emitter-base depletion layer and the corresponding recombination current increases. On the other hand, the collector current Ic changes with a change in the transistor structure such as impurity concentrations, depths, and sizes of the base region and the emitter region. The simulation results show that the base current Ib substantially does not change under the effect of the positive fixed charges while the collector current Ic increases. In other words, The Gummel characteristics in FIG. 2 show that the transistor structure changes under the effect of the positive fixed charges when the impurity concentration is too low at the surface of the base region.

Figure 3:
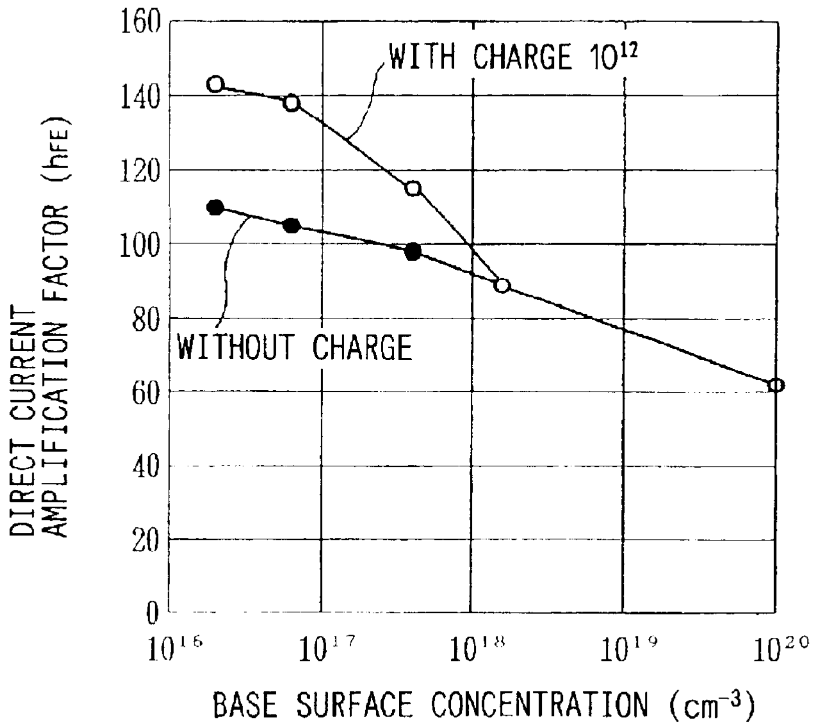
FIG. 3 is a graph showing the simulation results for the direct current amplification ($h_{FE}$) characteristics of an npn transistor with respect to impurity concentration at the surface of a base region of the transistor in both cases with and without the positive fixed charges.

Furthermore, as shown in FIG. 3, the above problems encountered with the proposed device of FIG. 24 can be addressed by raising the impurity concentration at the surface of the base region. The first embodiment is based on the above simulation results, so the bipolar transistor 35 includes the high impurity concentration p-type base region 50 for raising the impurity concentration at the surface of the base region 48.

Figure 4:
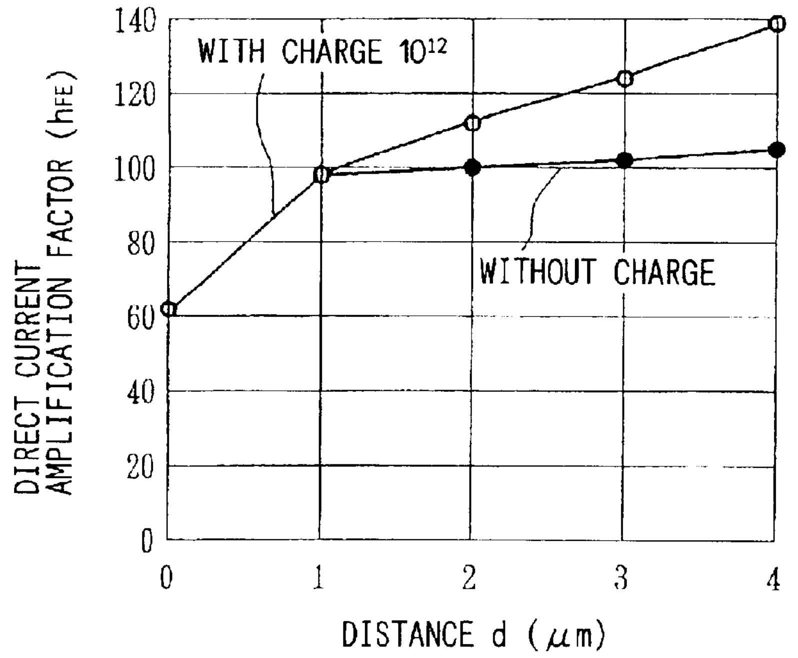
FIG. 4 is a graph showing the simulation results for the direct current amplification ($h_{FE}$) characteristics of an npn transistor with respect to the distance d between a high impurity concentration region and an emitter region of the transistor in both cases with and without charges.
Figure 5:
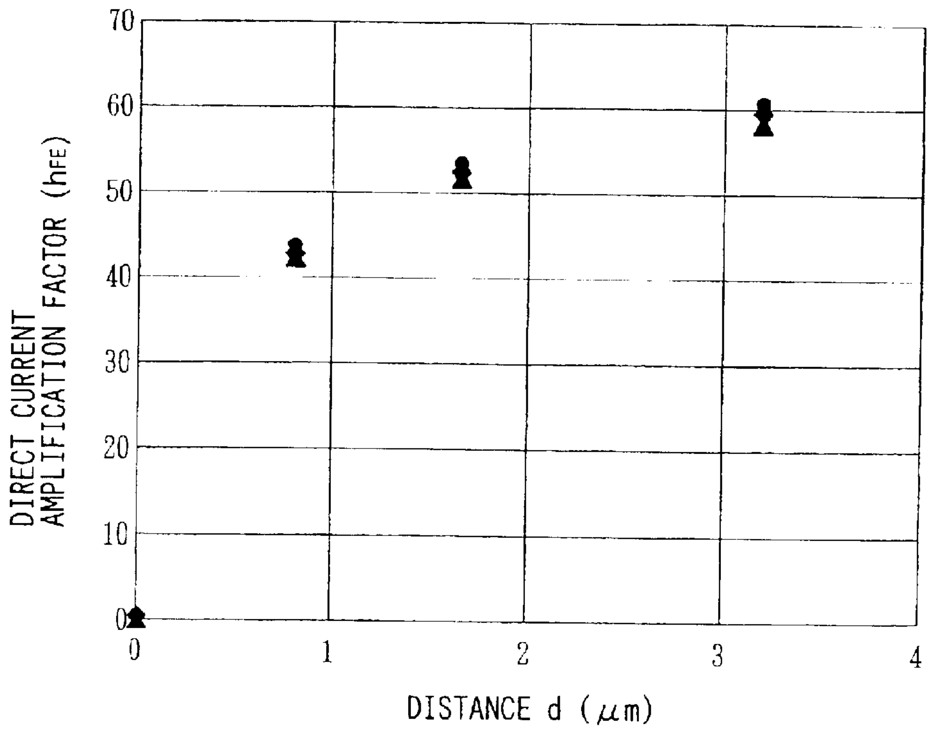
FIG. 5 is a graph showing the actually measured results for the direct current amplification ($h_{FE}$) characteristics of an npn transistor that has the same structure as used for the simulation of FIG. 4.
Figure 6:
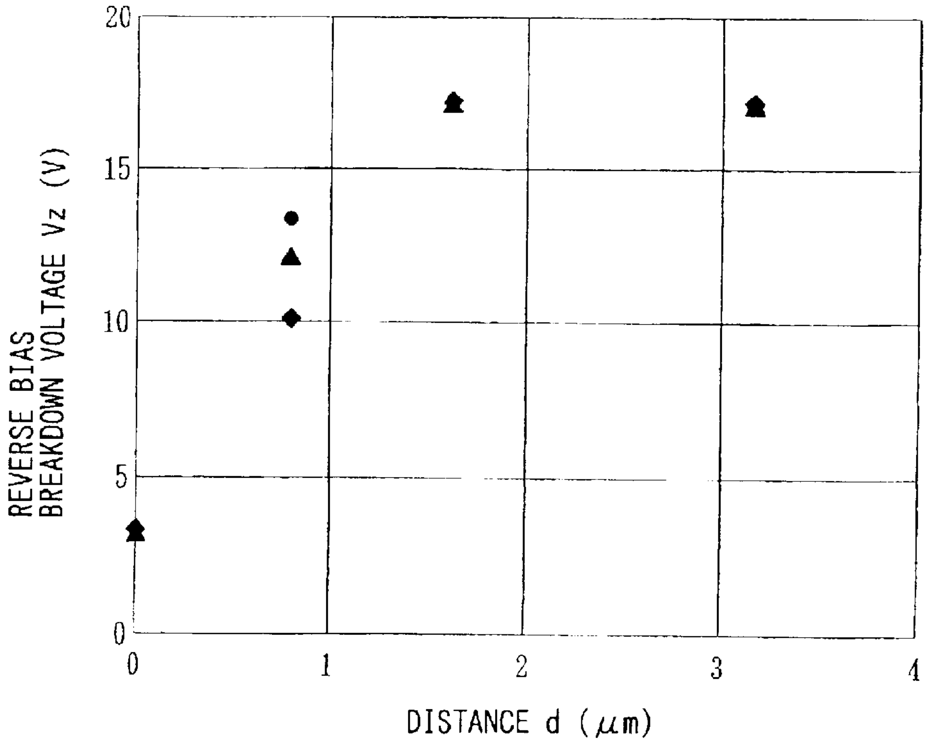
FIG. 6 is a graph showing the correlation between the reverse bias breakdown voltage and distance between a high impurity concentration region and an emitter region of an npn transistor.
Figure 7:
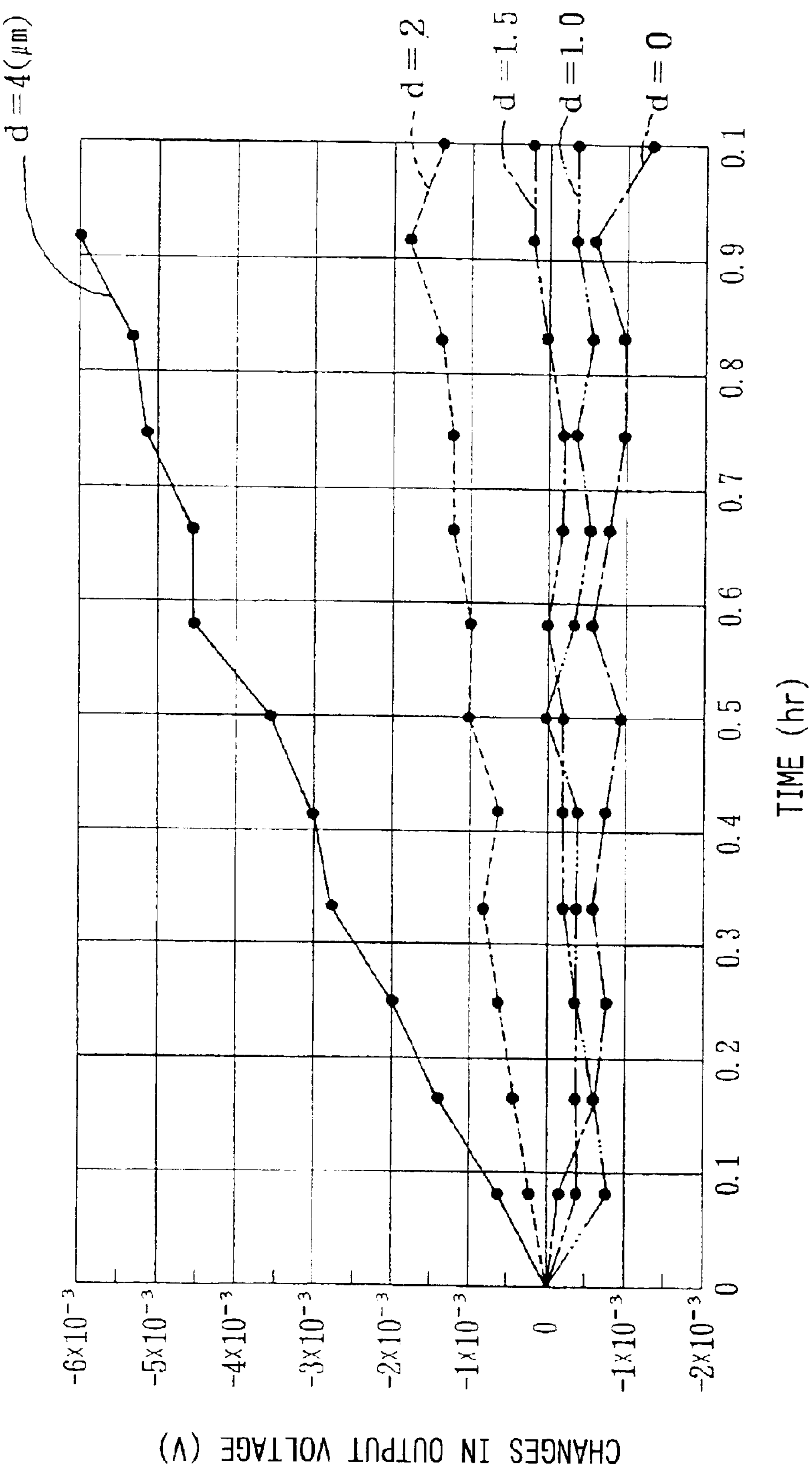
FIG. 7 is a graph showing the correlation between the changes in output voltage and time with various distances between a high impurity concentration region and an emitter region of an npn transistor.

In the Bi-CMOS semiconductor device 31 of FIG. 1, the distance d between the emitter region 49 and the high impurity concentration p-type base region 50 is 1 to 2 μm. Therefore, the impurity concentration is relatively high across the substantially entire surface of the base region 48. The position for forming the high impurity concentration p-type base region 50 will be described in detail. As shown in FIG. 4, $h_{FE}$ is relatively stable, with or without the charges, when the distance d is 1 to 2 μm. As shown in FIG. 5, the $h_{FE}$ values go down rapidly when the distance d is shorter than 1 μm. Furthermore, as shown in FIG. 6, the reverse bias breakdown voltage Vz (V) between the emitter region and the base region changes with the distance d, and the breakdown voltage goes down rapidly when the distance d is shorter than 1 μm. Therefore, the lower limit for the distance d should be 1 μm. As shown in FIG. 7, substantially no changes in the output voltage are observed and the output voltage becomes stable when the distance d is shorter than 2 μm. From the results shown in FIGS. 4 to 7, it is concluded that an optimal range for the distance d should be 1 to 2 μm.

In the Bi-CMOS semiconductor device 31 of FIG. 1, shifts in the characteristics of the bipolar transistor 35, which is caused by otherwise a low impurity concentration at the surface of the base region 48, is improved by forming the high impurity concentration p-type base region 50 at the surface of the base region 48. Moreover, the production cost is lowered because the high impurity concentration p-type base region 50 is simultaneously formed when the p-type source and drain regions 43 are formed in the n-type well region 41 of the CMOSFET 34. Furthermore, the distance d between the high impurity concentration p-type base region 50 and the emitter region 49 is set at 1 to 2 μm, so the shifts in the device characteristics are improved while sustaining the direct current amplification $h_{FE}$ and the breakdown voltage Vz.

Second Embodiment

Bi-CMOS semiconductor devices 52 of FIGS. 8A to 8D are different in structure of the high impurity concentration p-type base region from the Bi-CMOS semiconductor device 31 of FIG. 1. In the Bi-CMOS semiconductor device 52 of FIGS. 8A and 8B, a high impurity concentration p-type base region 54 is formed to surround an emitter region 49 in a bipolar transistor 53 of the Bi-CMOS device 52, as shown in FIG. 8B, in which aluminum electrodes 47 are not illustrated. In the Bi-CMOS semiconductor device 52 of FIGS. 8*c* and 8*d*, a bipolar transistor 53 includes a high impurity concentration p-type base contact region 54*a*, on which an aluminum electrode 47 is formed, and a high impurity concentration p-type base region 54*b* that surrounds an emitter region 49, as shown in FIG. 8D, in which aluminum electrodes 47 are not illustrated.

In the Bi-CMOS semiconductor devices 52 of FIGS. 8A to 8D, the size of the surface, at which the base region 48 is in contact with the insulating film 46 is smaller than in the Bi-CMOS semiconductor device 31 of FIG. 1, so the changes in device characteristics, which is caused by an inversion at the surface, is further reduced and stabilized in the Bi-CMOS semiconductor devices 52 of FIGS. 8A to 8D.

Third Embodiment

Figure 9A:
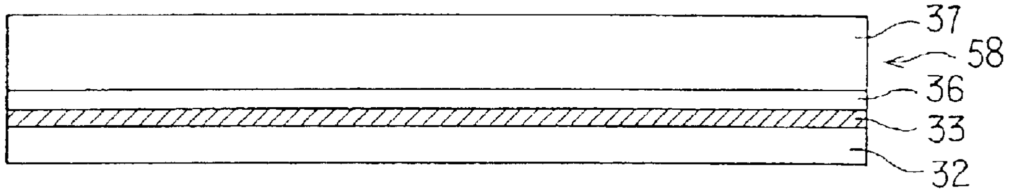
FIGS. 9A to 9P are cross-sectional views showing the structure of a semiconductor device according to a third embodiment in the manufacturing process of the device.
Figure 9B:
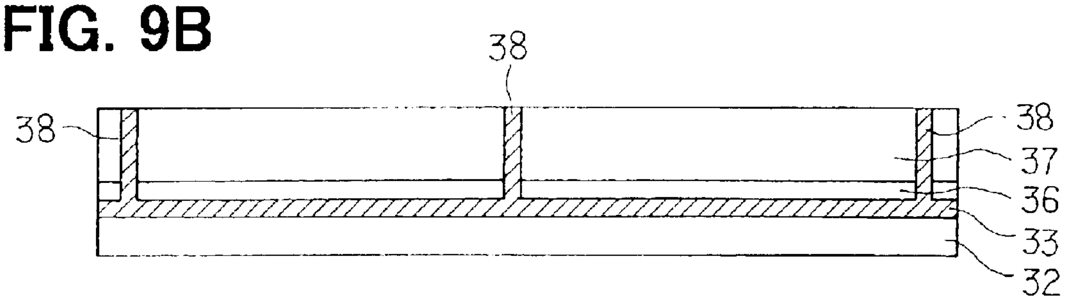
Figure 9C:
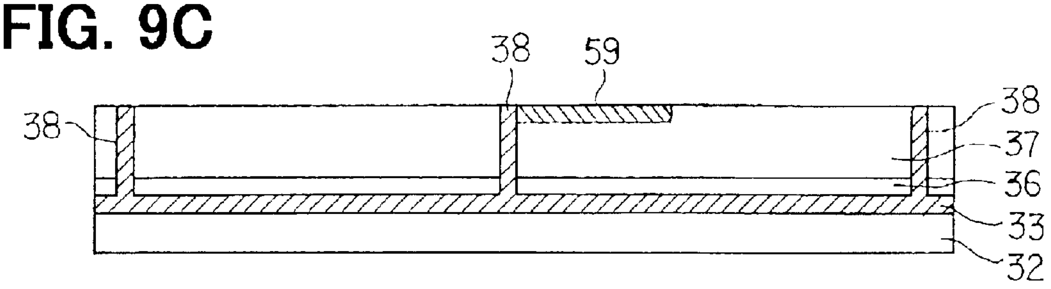
Figure 9D:
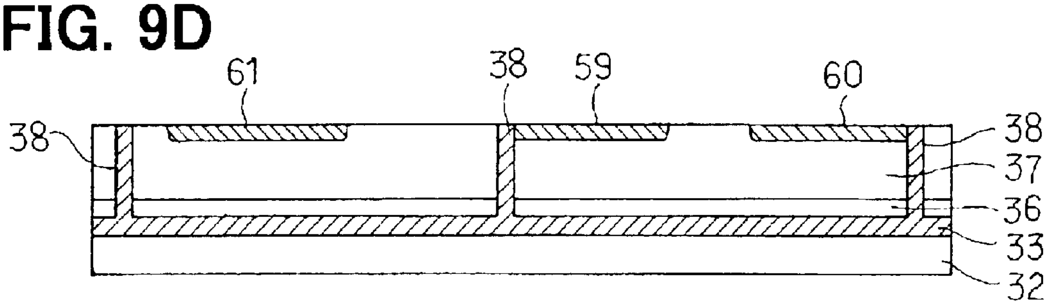
Figure 9E:
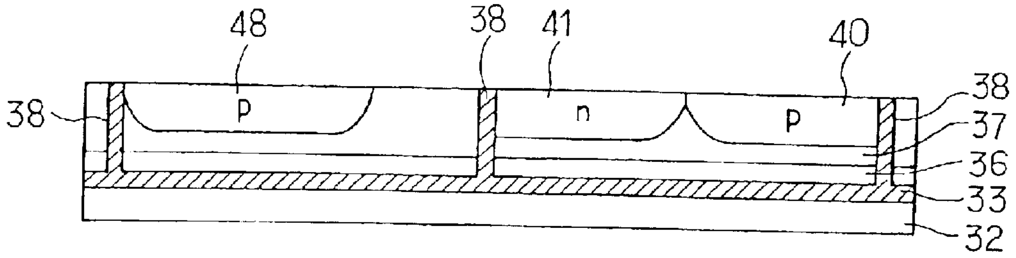
Figure 9F:
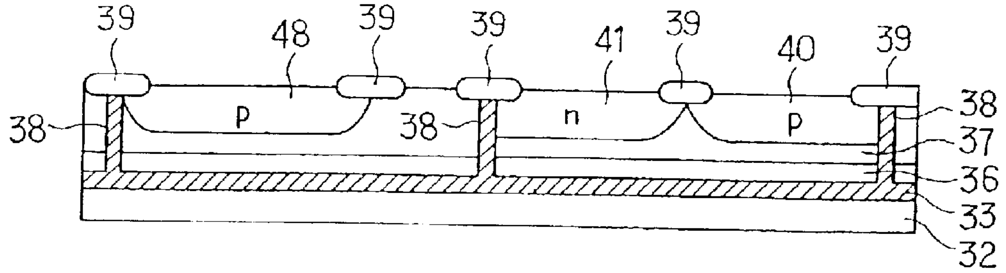
Figure 9G:
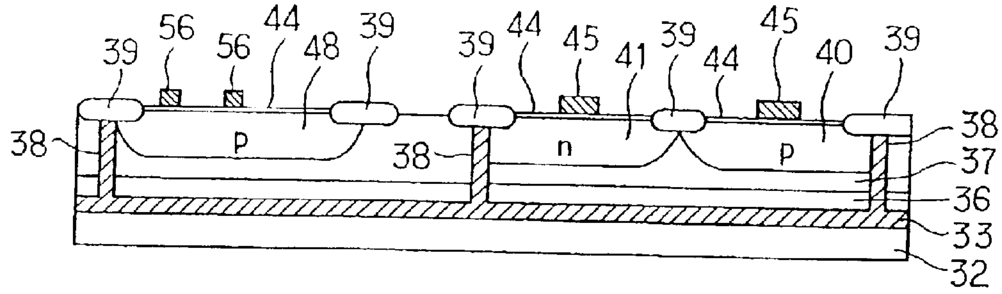
Figure 9H:
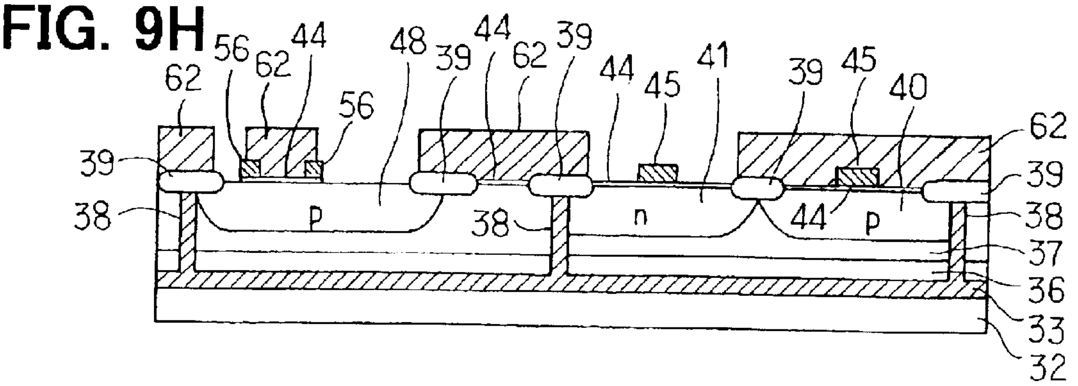
Figure 9I:
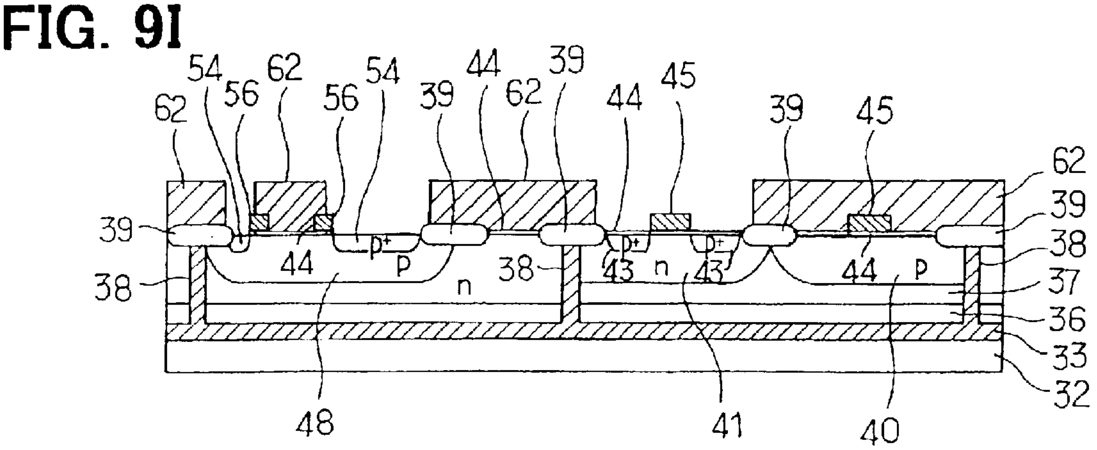
Figure 9J:
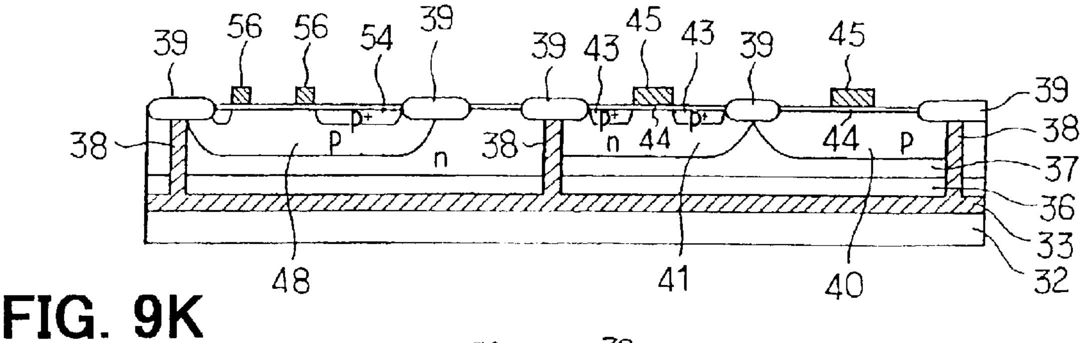
Figure 9K:
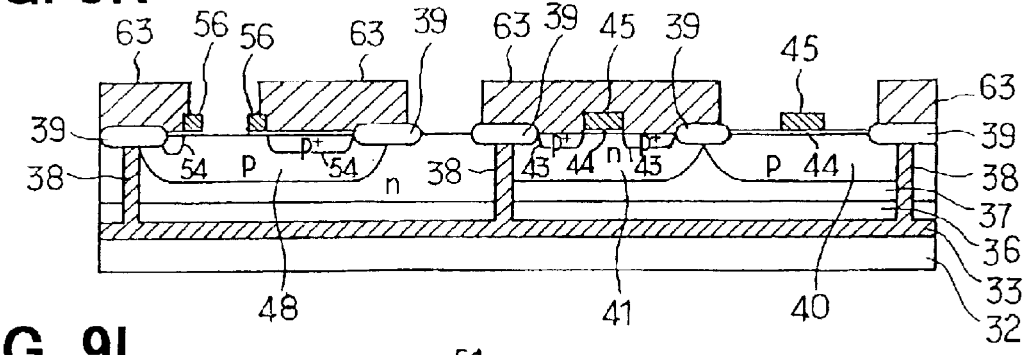
Figure 9L:
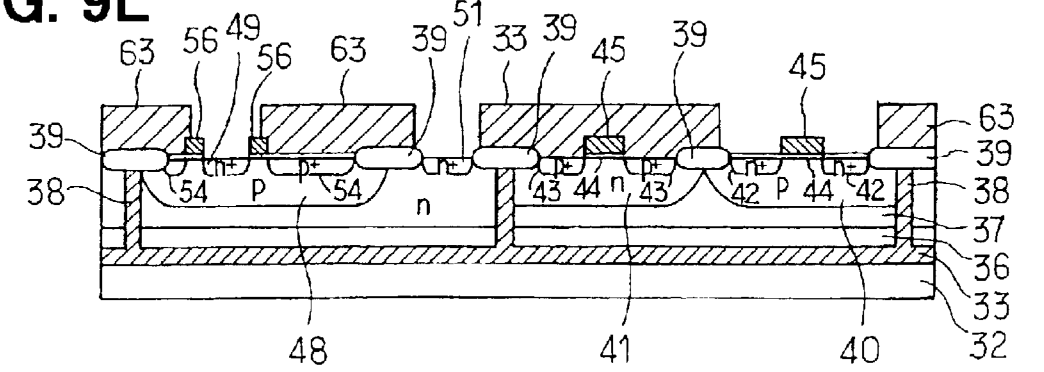
Figure 9M:
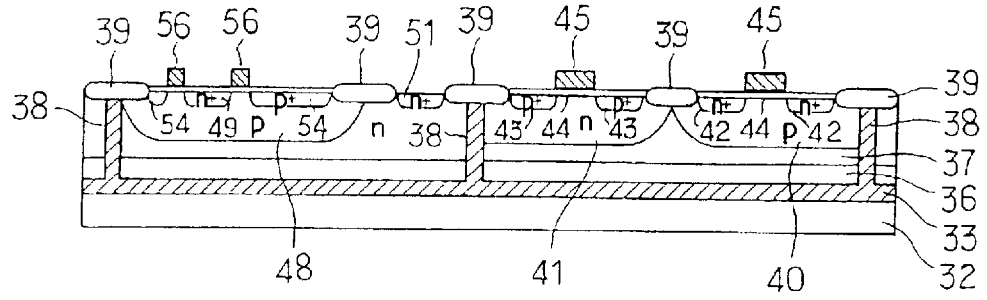
Figure 9N:
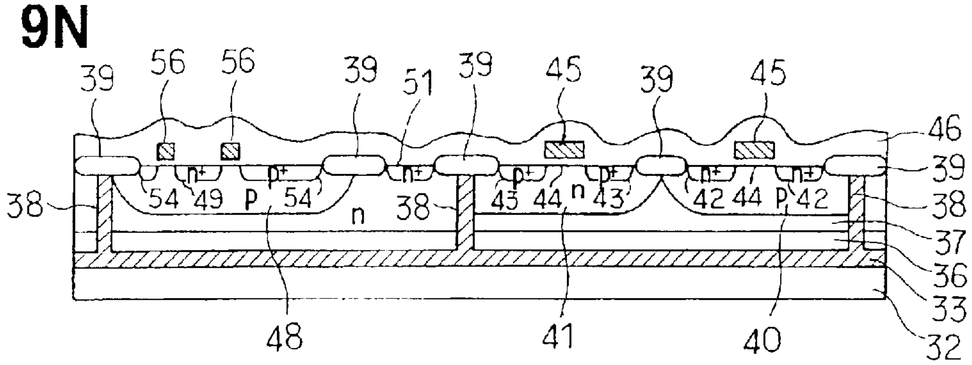
Figure 9O:
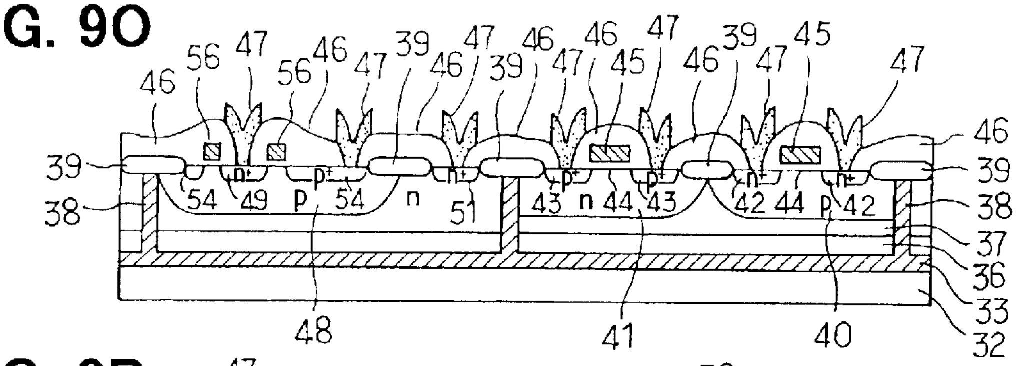
Figure 9P:
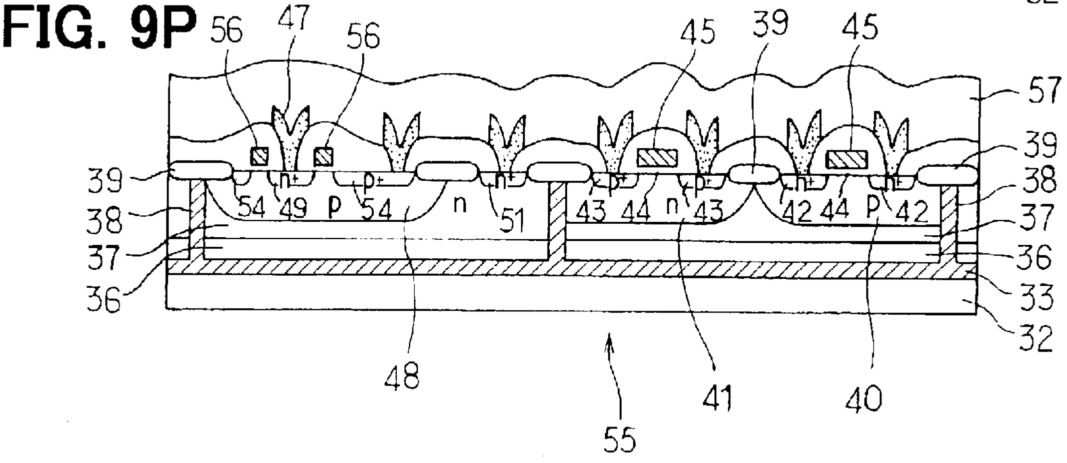

As shown in FIG. 9P, a Bi-CMOS semiconductor device 55 differs from the Bi-CMOS semiconductor devices 52 of FIGS. 8A to 8D in that a self alignment mask pattern 56 is included in order to precisely control the distance d between a high impurity concentration p-type base region 54 and an emitter region 49. An additional process step is not required for forming the self alignment mask pattern 56.

As shown in FIG. 9P, the self alignment mask pattern 56, which is made of a polycrystalline silicon film, is located over the surface of a base region 48 between the high impurity concentration p-type base region 54 and the emitter region 49 in addition to the structures of the Bi-CMOS semiconductor devices 52 of FIGS. 8A to 8D. In FIG. 9P, a passivation film 57 for protecting the device surface including aluminum electrodes 47 is illustrated.

The manufacturing steps for forming the Bi-CMOS semiconductor device 55 will be described. Firstly, an SOI substrate 58 shown in FIG. 9A is prepared. A silicon substrate 32 is several hundred microns in thickness. A high impurity concentration n-type silicon layer 36 and a low impurity concentration n-type silicon layer 37 are located on an insulating film 33 made of a silicon oxide film, which is located on the substrate 32. Then, trenches 38 for device isolation are formed in the SOI substrate 58, as shown in FIG. 9B. The trenches 38 are formed by forming grooves, depositing an insulating film on the sidewalls defining the grooves, and filling the grooves with polycrystalline silicon for planarization.

Next, an ion implanted area 59, corresponding to an n-type well region 41, is formed by ion implanting an n-type impuritiy, as shown in FIG. 9C. Similarly, an ion implanted area 60, corresponding to a p-type well region 40, is formed by ion implanting a p-type impurity, as shown in FIG. 9D. At the step for forming the p-type well region 40, an ion implanted area 61, corresponding to a p-type base region 48 of a bipolar transistor 53, is also formed.

Next, the p-type well region 40, the n-type well region 41, and the p-type base region 48 are formed from the ion implanted areas 59 through 61 by driving in the impurities at a diffusion step, as shown in FIG. 9E. LOCOS 39 are formed at predetermined locations on the substrate surface for device isolation at the surface, as shown in FIG. 9F. Next, a gate oxide film 44 is formed on the surface of the substrate of FIG. 9F, and gate electrodes 45 are formed from a polycrystalline silicon film, as shown in FIG. 9G.

At the same time, a self alignment mask pattern 56 is also formed from the polycrystalline silicon film on the surface of the bipolar transistor 53. The mask pattern 56 has a width corresponding to the distance d between an emitter region 49 and a high impurity concentration p-type base region 50 of the bipolar transistor 53.

Next, a photo resist 62 is patterned to form p-type source and drain regions 43 in the n-type well region 41 and a high impurity concentration p-type base region 54 in the p-type base region 48, as shown in FIG. 9H. The photo resist 62 is formed to be slightly offset from the edges of the mask pattern 56. As a result, the positions of the edges of the high impurity concentration p-type base region 54 can be aligned with a higher precision than an alignment precision achieved by the photo resist 62. Next, p-type impurities are introduced by ion implanting into the openings in the photo resist 62 to form the p-type source and drain regions 43 and the high impurity concentration p-type base region 54, as shown in FIG. 9I. Then, the photo resist 62 is stripped off, as shown in FIG. 9J, and a photo resist 63 is patterned for forming n-type source and drain regions 42, the high impurity concentration n-type emitter region 49, and a collector contact region 51, as shown in FIG. 9K. The edges of the photo resist 63 are slightly offset from the edges of the mask pattern 56. Then, n-type impurities are introduced by ion implanting to form the n-type source and drain regions 42, the high impurity concentration n-type emitter region 49, and the collector contact region 51, as shown in FIG. 9L.

Then, the photo resist 63 is stripped off, as shown in FIG. 9M, and an insulating film 46 is formed with a BPSG film, as shown in FIG. 9N. Contact holes are opened by photolithography and etching, and aluminum electrodes 47 are formed, as shown in FIG. 9O. Finally, a passivation film 57 is formed, and openings are made at the electrode pads to complete the wafer process, as shown in FIG. 9P.

The distance d between the emitter region 49 and the high impurity concentration p-type base region 54 can be controlled precisely by using the self alignment mask pattern 56 to achieve a high degree of process control. Furthermore, the production cost is lowered by simultaneously forming the gate electrodes 45 of the CMOSFET 34 and the self alignment mask pattern 56 from the same polycrystalline silicon film because no additional process steps are required.

Fourth Embodiment

Figure 10:
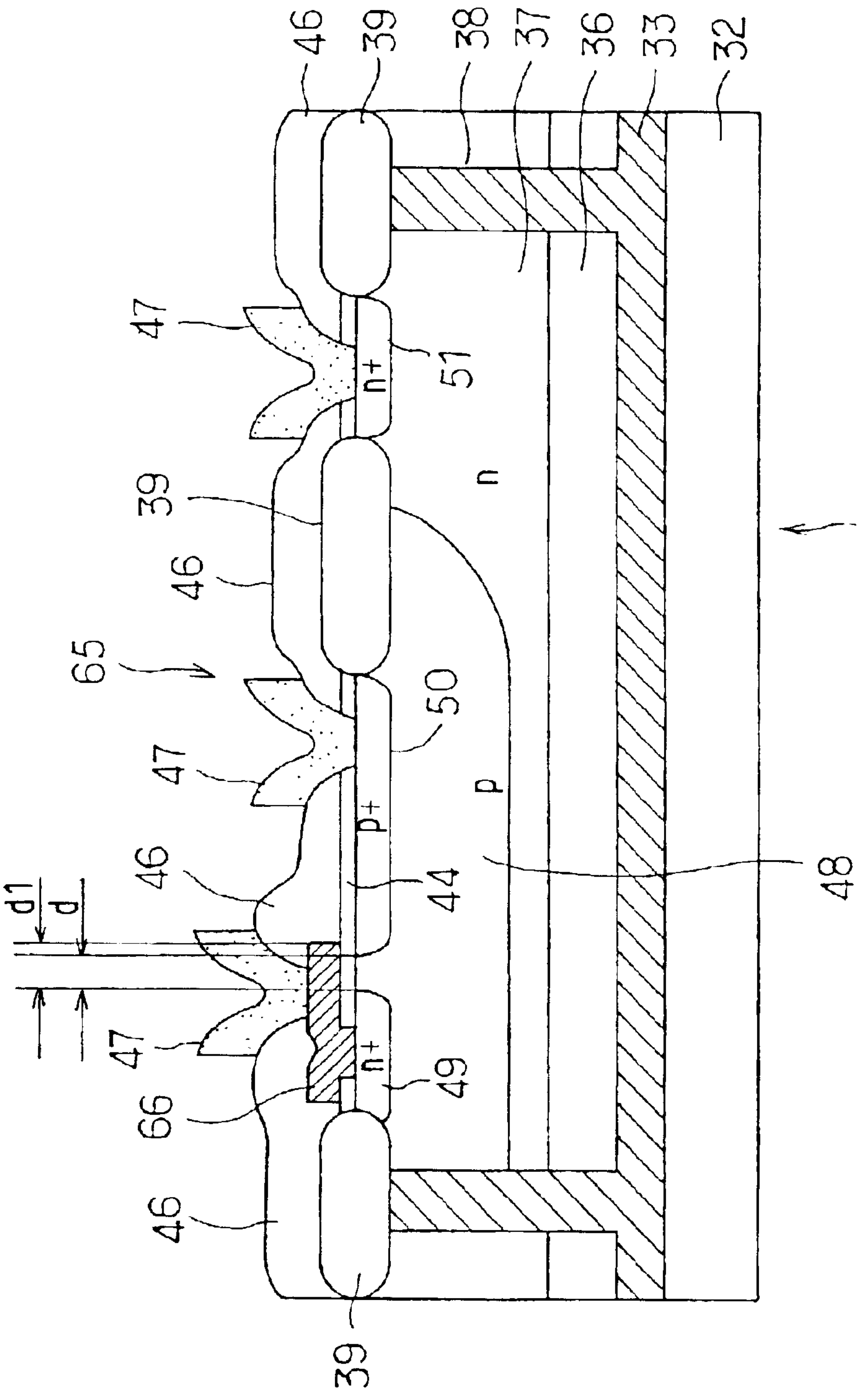
FIG. 10 is a cross-sectional view of a bipolar transistor of a semiconductor device according to a fourth embodiment.

As shown in FIG. 10, a bipolar transistor 65 in a Bi-CMOS device 64 has an emitter support area 66 as a self alignment mask pattern. Although not shown, the Bi-CMOS device 64 includes a CMOS 34 having the same structure as the CMOS 34 in FIG. 1.

In the bipolar transistor 65, an emitter region 49 is formed before p-type source and drain regions 43 of the CMOS 34 are formed, and the emitter support area 66, which is electrically connected to the emitter region 49, is formed after a gate insulating film 44 is formed. The emitter support area 66 is formed using a polycrystalline silicon film at the same time as gate electrodes 45 of the CMOS 34 are formed, and an electric contact is established with the emitter support area 66 through a contact hole opened in the gate insulating film 44 in an area corresponding to the emitter region 49. One end of the emitter support area 66 extends out of the emitter region 49 by a predetermined distance d1.

Next, when forming the high impurity concentration p-type base region 50 by introducing impurities, the emitter support area 66 is used as a self alignment mask pattern. The distance d between the high impurity concentration p-type base region 50 and the emitter region 49 is slightly smaller than d1. Therefore, a desired distance d is achieved with a high precision by taking into account how much smaller the distance d will be than the predetermined distance d1 of the emitter support area 66 and compensating the extension $d_1$ in advance.

Fifth Embodiment

Figure 11:
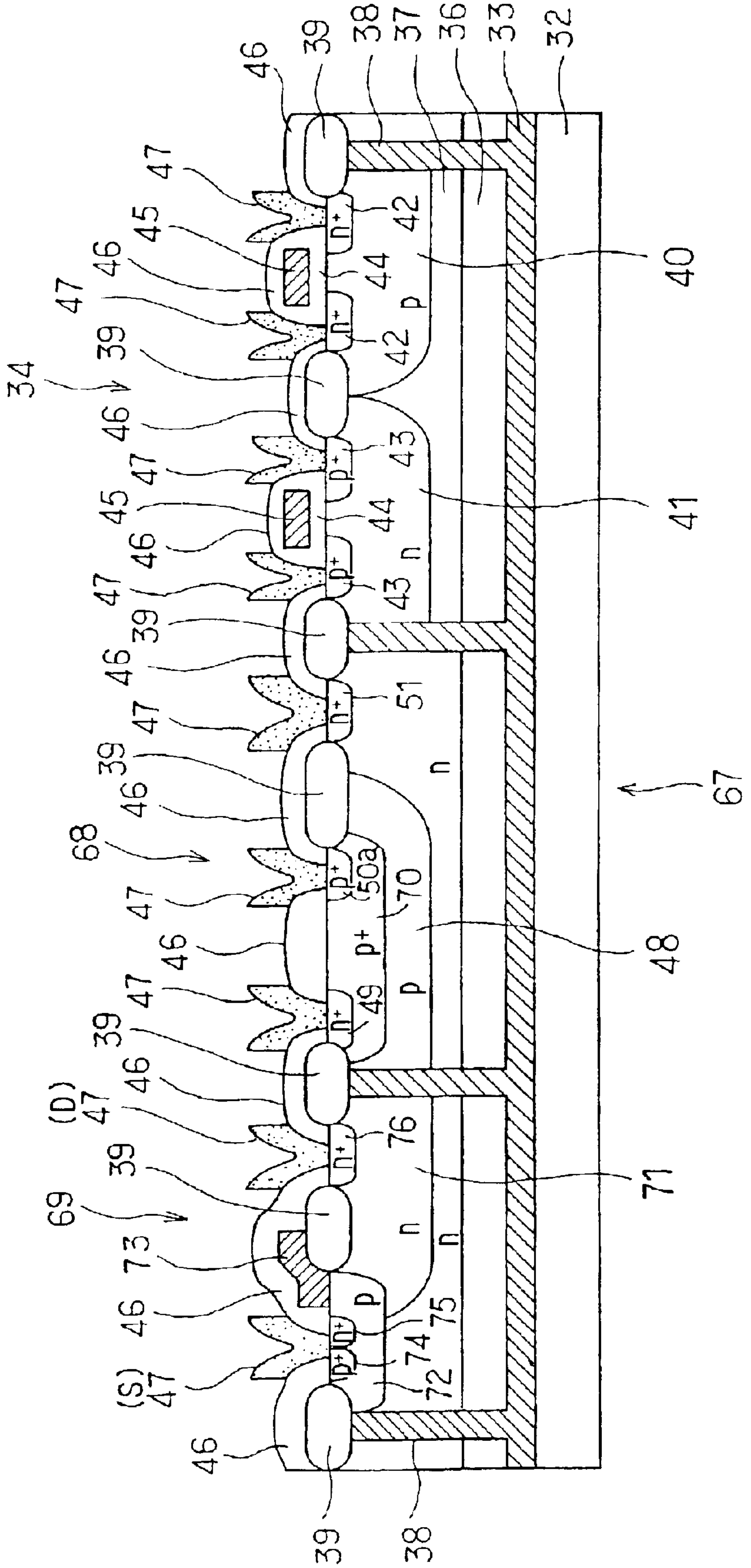
FIG. 11 is a partial cross-sectional view of a semiconductor device according to a fifth embodiment.

As shown in FIG. 11, a Bi-CMOS semiconductor device 67 differs from the Bi-CMOS semiconductor device 31 of FIG. 1 in that a double diffused CMOSFET (DCMOSFET) 69 is included in addition to a bipolar transistor 68 and a CMOS 34 as a single unit in the Bi-CMOS 67. A step for forming the DCMOSFET 69 is used for forming a high impurity concentration p-type base region 70 of the bipolar transistor 68.

In the manufacturing process of the Bi-CMOS 67, a drain region 71 of the DCMOSFET 69 and an n-type well region 41 of the CMOSFET 34 are simultaneously formed. Then, when a p-type region 72, which makes up a channel and has a higher level of impurity concentration than the p-type well 40, is formed, the high impurity concentration p-type base region 70 is simultaneously formed in a base region 48 of the bipolar transistor 68. Next, a gate oxide film 44 and a gate electrode 73 of the DCMOSFET 69 are formed, and a p-type channel contact region 74, an n-type source region 75, and a drain contact region 76 are formed in the DCMOSFET 69. Subsequently, an insulating film 46 and aluminum electrodes 47 are formed. One of the aluminum electrodes 47 that is formed to span over the p-type channel contact region 74 and the n-type source region 75 is a source electrode. Another one of the aluminum electrodes 47 that is formed on the drain contact region 76 is a drain electrode. The gate electrode 73 is electrically connected to the outside through a gate electrode metal, which is not illustrated.

In the manufacturing process of the Bi-CMOS 67, the high impurity concentration p-type base region 70 is formed in the bipolar transistor 68 without adding extra steps. The interface between the high impurity concentration p-type base region 70 and the insulating film 46 are so stable that relatively good device characteristics of the bipolar transistor 68 are acquired in the Bi-CMOS 67.

Sixth Embodiment

Figure 12:
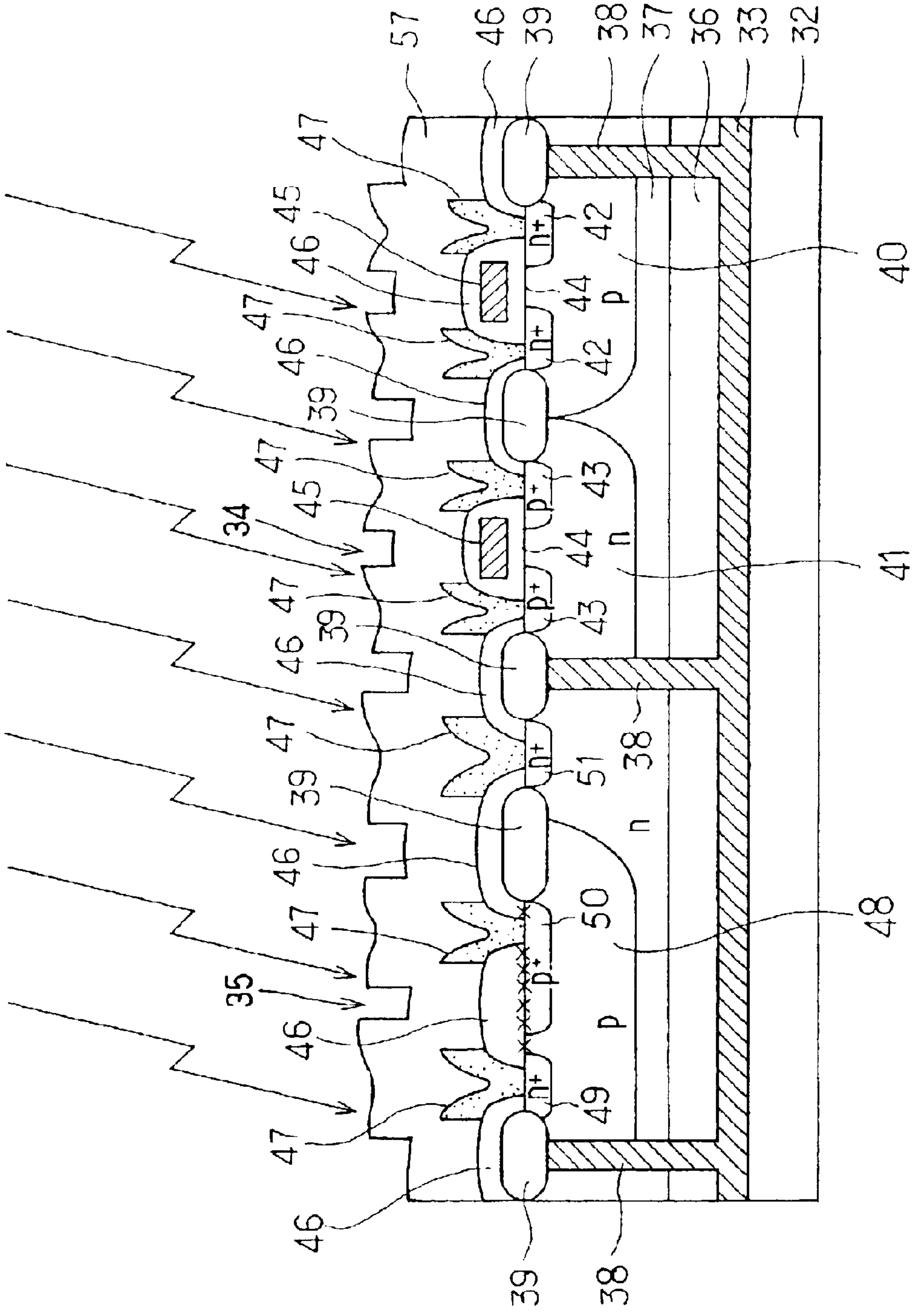
FIG. 12 is a partial cross-sectional view of a semiconductor device according to a sixth embodiment.

As shown in FIG. 12, in the method according to the sixth embodiment, ultraviolet rays are exposed to a Bi-CMOSFET semiconductor device having the same structure as the Bi-CMOSFET semiconductor device 31 of FIG. 1 to remove hydrogen atoms from the interface, which is a Si—$SiO_2$ interface, between a high impurity concentration p-type base region 50 and an insulating film 46 and from the interface between a p-type base region 48 and the insulating film 46.

Positive fixed charges, which is denoted by "X" marks in FIG. 12, are generated at the interface. Changes in the amount of the positive fixed charges can be attributed to shifts of hydrogen atoms, which are bonded to silicon with dangling bonds at the interface, under certain biasing conditions used for driving the bipolar transistor 35, or due to the manufacturing process of the Bi-CMOSFET semiconductor device.

It is known that when an insulating film containing a large amount of hydrogen atoms such as a silicon nitride film formed by a plasma CVD method is used as a passivation film 57, hydrogen atoms diffuse to the interface during a thermal treatment step. Therefore, device characteristics of the bipolar transistor 35 are further stabilized by providing the Bi-CMOSFET semiconductor device 1 of FIG. 24 with a treatment step for reversing the adverse effects of such hydrogen atoms.

As shown in FIG. 12, after the passivation film 57 is formed and annealed, the passivation film 57 is exposed to ultraviolet rays to remove the hydrogen atoms located at the interface by adding energy to the hydrogen atoms. The passivation film 57 needs to transmit ultraviolet rays to expose the Si—SiO2 interface to the ultraviolet rays and provide enough energy with the hydrogen atoms.

Figure 13:
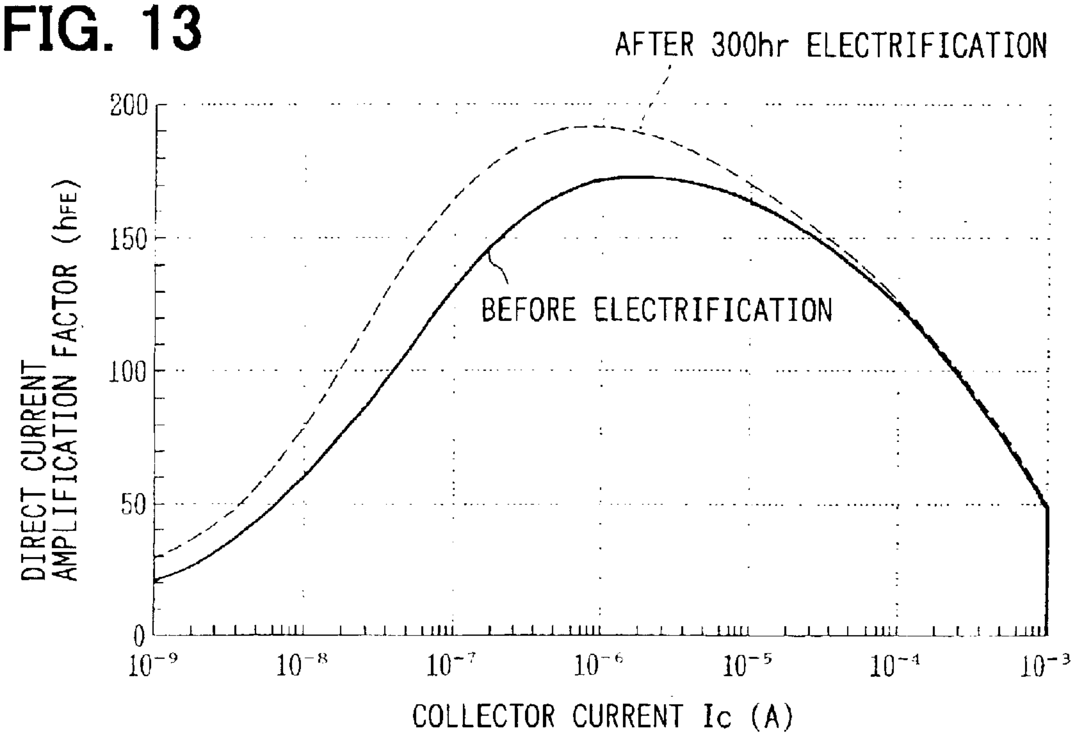
FIG. 13 is a graph showing the correlation between the direct current amplification factor and the collector current without any ultraviolet radiation.
Figure 14:
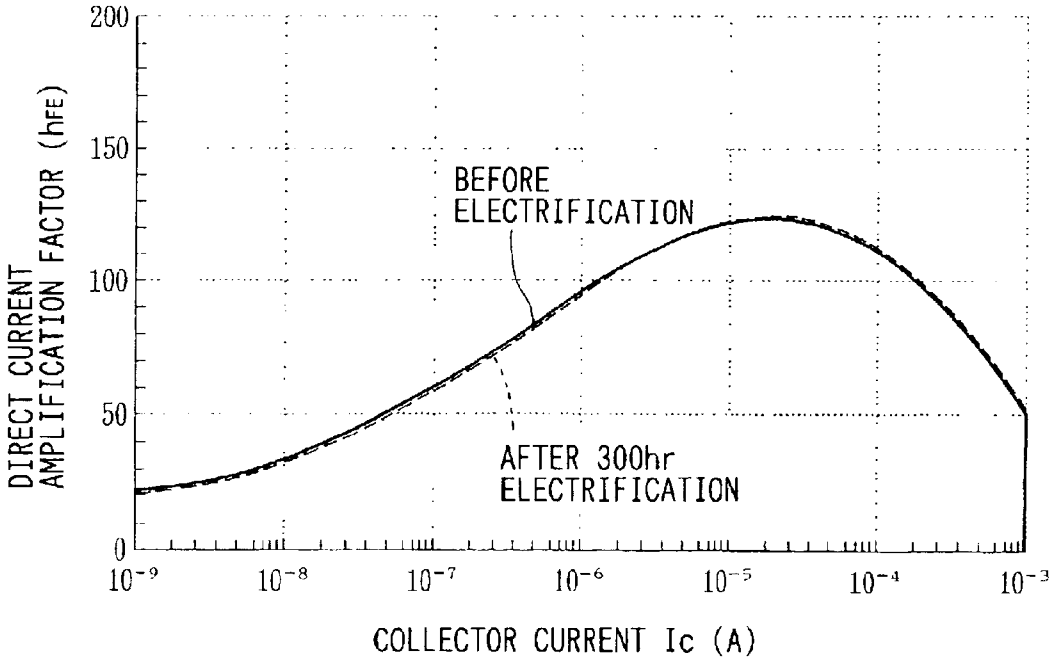
FIG. 14 is a graph showing the correlation between the direct current amplification factor and the collector current with ultraviolet radiation.

By removing the hydrogen atoms from the Si—SiO2 interface with ultraviolet rays after the formation and annealing of the passivation film 57, the bipolar transistor 35 becomes more stable in the device characteristics. Ten samples that had not been exposed to ultraviolet rays showed changes in device characteristics between the initial conditions and after 300 hours of operation, as shown in FIG. 13. On the other hand, three samples that had been exposed to ultraviolet rays showed substantially no changes in the device characteristics between the initial conditions and after 300 hours of operation, as shown in FIG. 14.

Although ultraviolet rays are exposed to the Bi-CMOSFET semiconductor device having the same structure as the Bi-CMOSFET semiconductor device 31 of FIG. 1 in the method of FIG. 12, the benefit of the UV irradiation can be applied to the Bi-CMOSFET semiconductor device 1 of FIG. 24, which has a wider spacing between the high impurity concentration p-type base region 20 and the emitter region 19.

Seventh Embodiment

Figure 15:
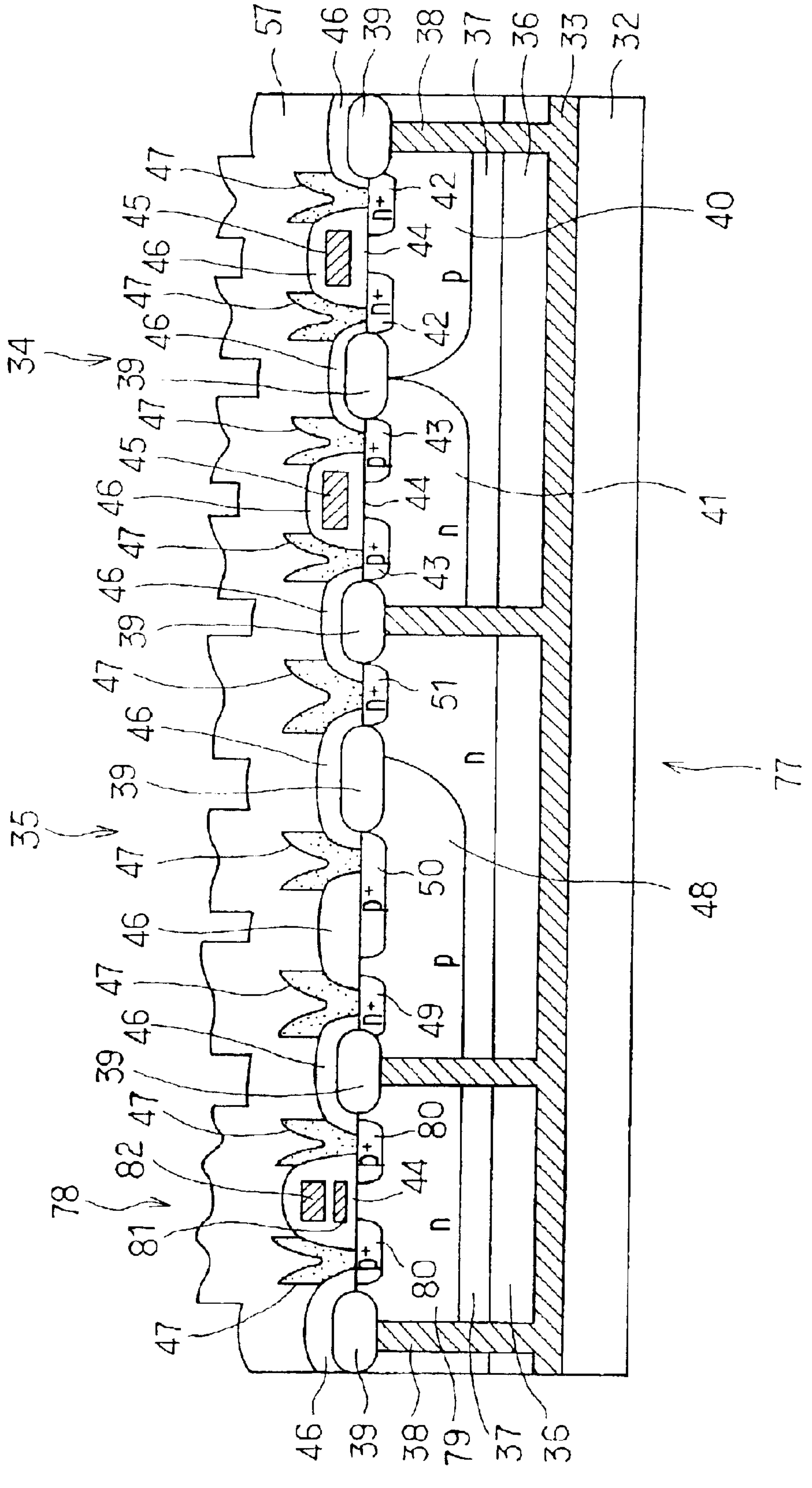
FIG. 15 is a partial cross-sectional view of a semiconductor device according to a seventh embodiment.

As shown in FIG. 15, a Bi-CMOSFET semiconductor device 77 differs from the Bi-CMOSFET semiconductor device of FIG. 12 in that an EPROM 78 is included in the Bi-CMOS device 77. The EPROM 78 has a structure for erasing contents of the memory under an ultraviolet radiation, and, for this reason, a film that is highly transparent to ultraviolet rays is used as a passivation film 57, just as in the Bi-CMOSFET semiconductor device of FIG. 12.

The EPROM 78 has a standard EPROM structure. In the EPROM 78, an n-type well region 79, which is similar to an n-type well region 41, is located in a low impurity concentration n-type silicon layer 37, and p-type source and drain regions 80 are located in the n-type well region 79. A floating gate 81 is located above a gate insulating film 44, and a common gate 82 is located on the floating gate 81 with another insulating film in-between.

Each time the Bi-CMOS 77 is exposed to ultraviolet rays for erasing the memory content in the EPROM 78, hydrogen atoms at the interface between a base region 48 and an insulating film 46 in a bipolar transistor 35 are removed. Therefore, the bipolar transistor 35 of the Bi-CMOS 77 has more stable device characteristics than the bipolar transistor 35 of the Bi-CMOSFET semiconductor device 31 in FIG. 1.

Eighth Embodiment

Figure 16A:
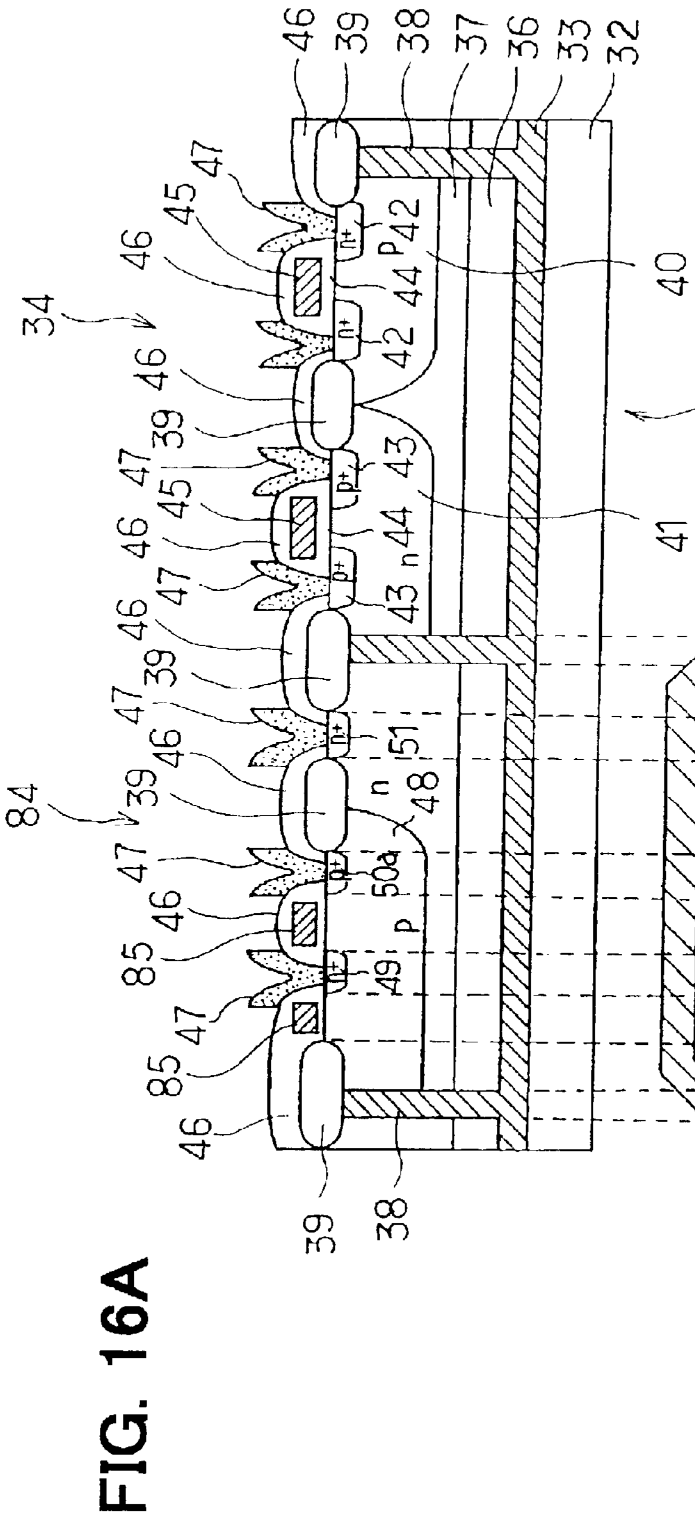
FIG. 16A is a partial cross-sectional view of a semiconductor device according to an eighth embodiment and FIG. 16B is a plan view of a bipolar transistor in the device according to the seventh embodiment.
Figure 16B:
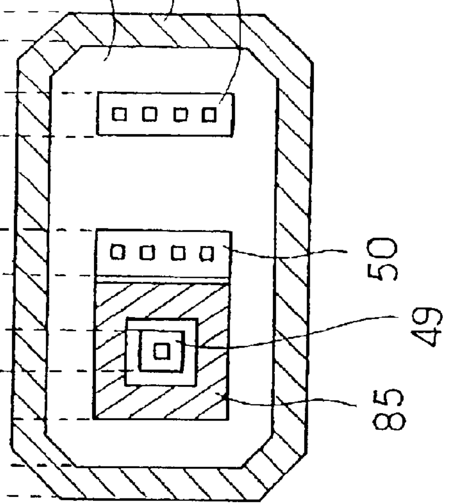

As shown in FIGS. 16A and 16B, a Bi-CMOSFET semiconductor device 83 differs from the Bi-CMOSFET semiconductor device 31 in FIG. 1, which includes the high impurity concentration p-type base region 50 having a distance of 1 to 2 $\mu$m from the emitter region 49, in that a polycrystalline silicon film 85 is located in the bipolar transistor 84 as a hydrogen barrier layer.

In the method of FIG. 12, ultraviolet rays were exposed to the Bi-CMOSFET semiconductor device of FIG. 12 for removing the hydrogen atoms, which are bonded to silicon with dangling bonds and undesirably affect the characteristics of the bipolar transistor 35, from the Si—$SiO_2$ interface. On the other hand, in the Bi-CMOSFET semiconductor device 83, the polycrystalline silicon film 85 is included in order to prevent the hydrogen atoms existing in a passivation film 57, which is not shown in FIGS. 16A and 16B, from traveling to the interface between a base region 48 and an insulating film 44 of FIG. 16A and from changing the characteristics of a bipolar transistor 84.

The bipolar transistor 84 includes an emitter region 49 and a base contact region 50*a* in the base region 48. However, the polycrystalline silicon film 85, which is the hydrogen barrier film, is located above the interface between the base region 48 and the insulating film 44 of FIG. 16A in such a way that the polycrystalline silicon film 85 surrounds the emitter region 49 as viewed in FIG. 16B. The polycrystalline silicon film 85 is simultaneously formed at the step of forming gate electrodes 45 of a CMOSFET 34 of FIG. 16A. Therefore, the Bi-CMOSFET semiconductor device 83 of FIG. 16A can be manufactured using the manufacturing process shown by FIGS. 25A to 25G, which are the ones for the proposed semiconductor device 1 of FIG. 24, without any additional steps.

Ninth Embodiment

Figure 17:
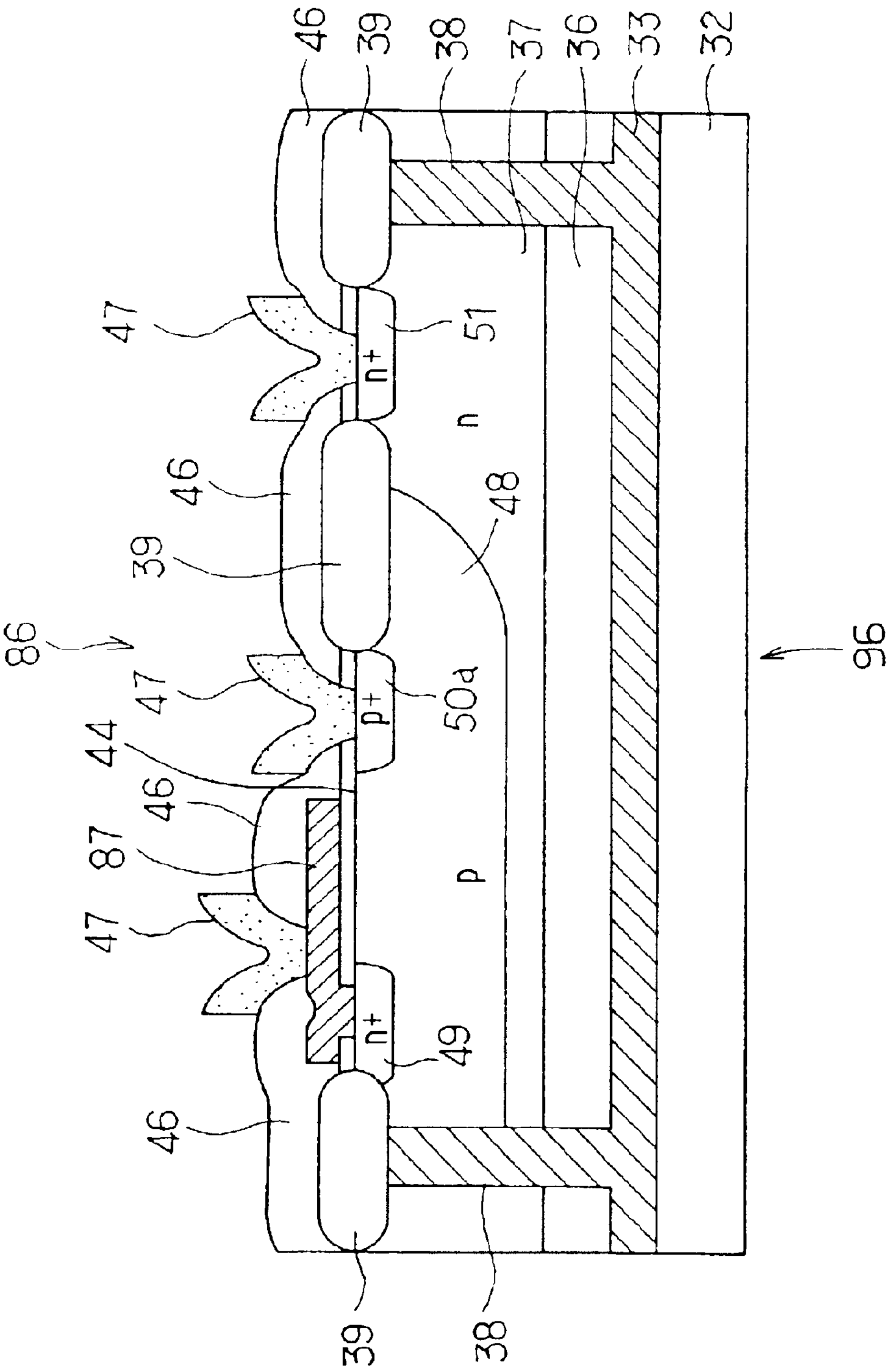
FIG. 17 is a cross-sectional view of a bipolar transistor in a semiconductor device according to a ninth embodiment.

As shown in FIG. 17, a Bi-CMOSFET semiconductor device 96 differs from the Bi-CMOSFET semiconductor device 83 of FIG. 16A in that a bipolar transistor 86 includes an emitter electrode 87, which is made of a polycrystalline silicon film, to function as a hydrogen barrier film. Although not shown, the Bi-CMOS device 96 includes a CMOSFET 34 having the same structure as the CMOSFET 34 in FIG. 16A. In the bipolar transistor 84 of FIG. 16*a*, the polycrystalline silicon film 85 is floating. In the bipolar transistor 86 of FIG. 17, on the other hand, the emitter electrode 87, which is in electric contact with the emitter region 49, has the same function as the polycrystalline silicon film 85.

The emitter electrode 87 is simultaneously formed in the process for forming the CMOSFET 34, which is not shown.

An emitter contact hole is formed in a gate insulating film 44. Then, the emitter electrode 87 is formed from a polycrystalline silicon film, which is also used for forming gate electrodes 45. The emitter electrode 87 is patterned in such a way that an edge of the emitter electrode 87 extends toward and near the edge of a base contact area 50*a*. As a result, the emitter electrode 87 is located above the interface between the base region 48 and the insulating film 44 of FIG. 16A such that the interface is substantially completely covered by the emitter electrode 87.

Therefore, the hydrogen atoms, which can otherwise bond to silicon at the interface with dangling bonds and undesirably affect the characteristics of the bipolar transistor 86, are not allowed to travel from an insulating film 46 or a passivation film 57, which is not shown in FIG. 17, so the bipolar transistor 86 has relatively stable device characteristics.

Tenth Embodiment

Figure 18A:
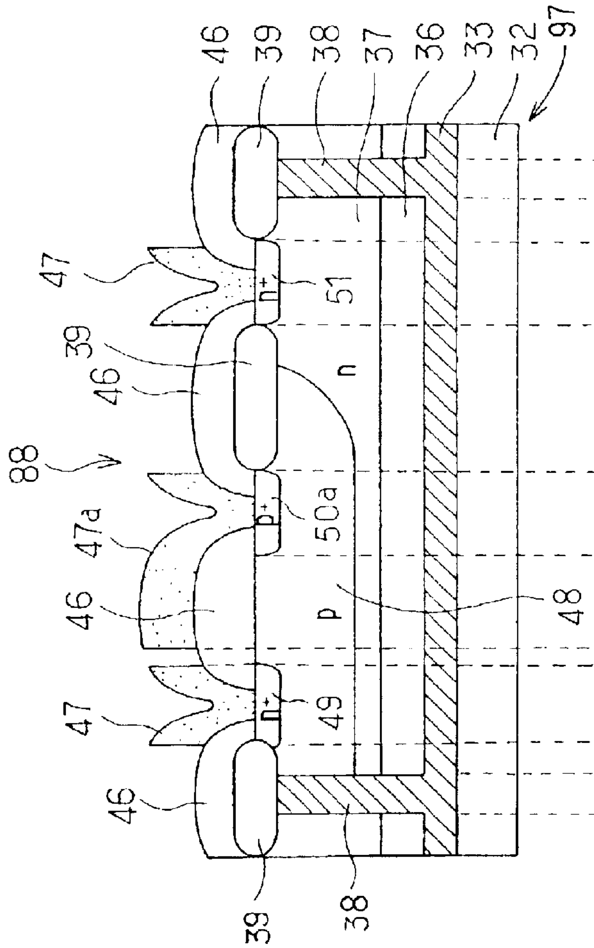
FIG. 18A is a cross-sectional view of a bipolar transistor in a semiconductor device according to a tenth embodiment and FIG. 18B is a plan view of the bipolar transistor according to the tenth embodiment.
Figure 18B:
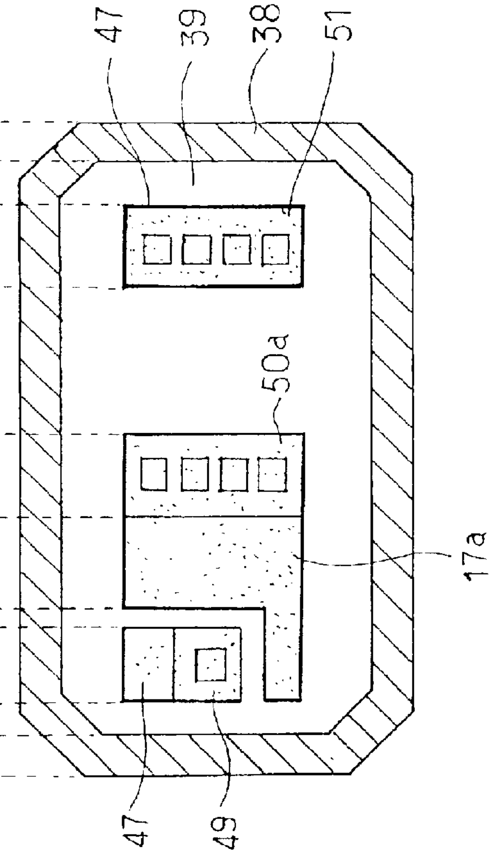

As shown in FIGS. 18A and 18B, a Bi-CMOSFET semiconductor device 97 differs from the Bi-CMOSFET semiconductor device 83 of FIG. 16A in that a bipolar transistor 88 includes an aluminum electrode 47*a* as a base electrode and as a hydrogen barrier film. Although not shown, the Bi-CMOS device 97 includes a CMOSFET 34 having the same structure as the CMOSFET 34 in FIG. 16A. As shown in FIGS. 18A and 18A, the aluminum electrode 47*a* extends above the interface between a base region 48 and an insulating film 46 of FIG. 18A such that the interface is substantially completely covered by the aluminum electrode 47*a* to prevent hydrogen atoms from traveling to the interface from a passivation film 57, which is located on the aluminum electrode 47*a* although not shown in FIG. 18A. Therefore, the bipolar transistor 88 has relatively stable device characteristics.

Eleventh Embodiment

Figures 19A, 19B:
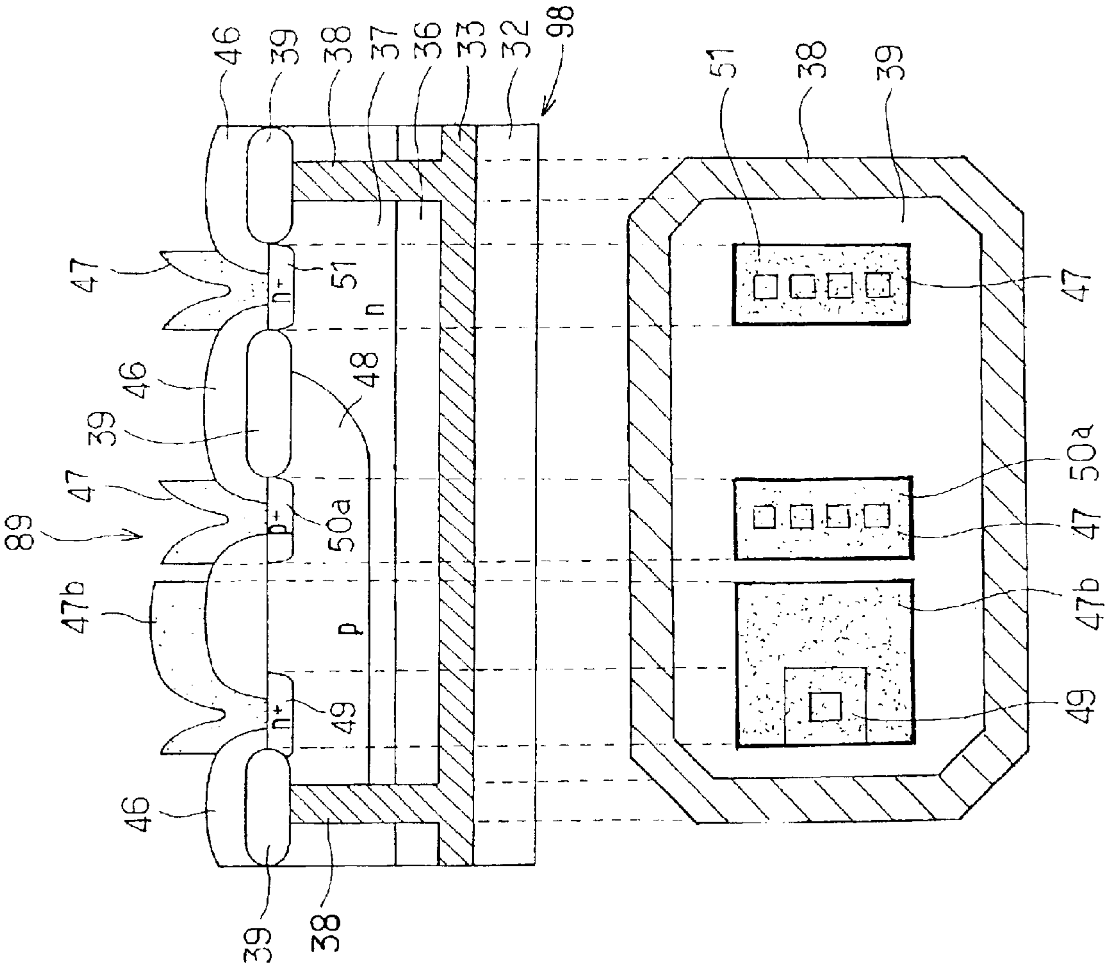
FIG. 19A is a cross-sectional view of a bipolar transistor in a semiconductor device according to an eleventh embodiment and FIG. 19B is a plan view of the bipolar transistor according to the eleventh embodiment.

As shown in FIGS. 19A and 19B, a Bi-CMOSFET semiconductor device 98 differs from the Bi-CMOSFET semiconductor device 97 of FIGS. 18A and 18B in that a bipolar transistor 89 includes an aluminum electrode 47*b* as an emitter electrode and as a hydrogen barrier film. Although not shown, the Bi-CMOS device 97 includes a CMOSFET 34 having the same structure as the CMOSFET 34 in FIG. 16A. As shown in FIGS. 19A and 19B, the aluminum electrode 47*b* extends above the interface between a base region 48 and an insulating film 46 of FIG. 19A such that the interface is substantially completely covered by the aluminum electrode 47*b* to prevent hydrogen atoms from traveling to the interface from a passivation film 57, which is located on the aluminum electrode 47*b* although not shown in FIG. 18A. Therefore, the bipolar transistor 88 has relatively stable device characteristics in the same manner as the Bi-CMOSFET semiconductor device 97 of FIG. 18A.

Twelfth Embodiment

Figure 20:
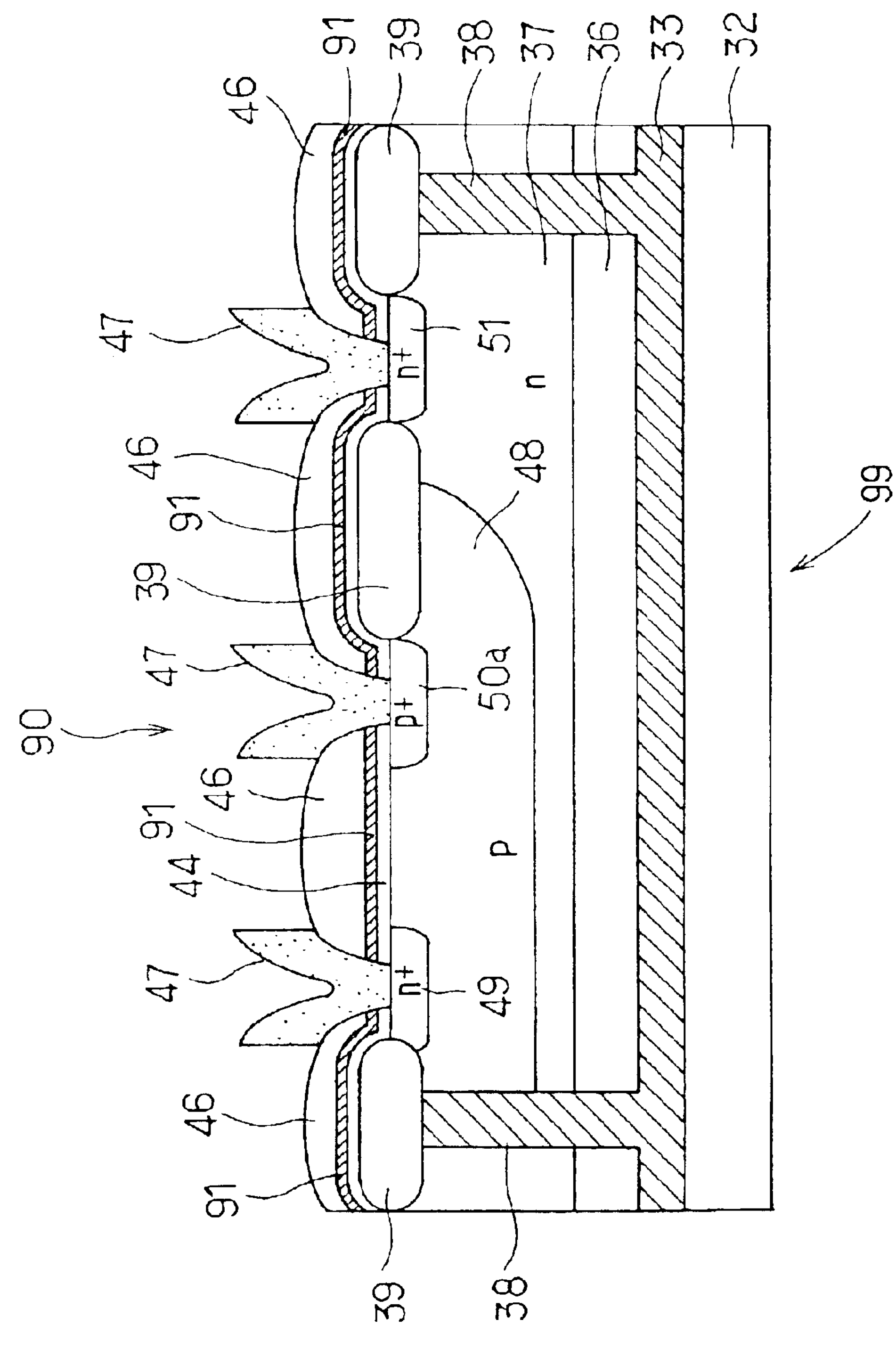
FIG. 20 is a cross-sectional view of a bipolar transistor in a semiconductor device according to a twelfth embodiment.

As shown in FIG. 20, a Bi-CMOSFET semiconductor device 99 differs from the Bi-CMOSFET semiconductor device 83 of FIG. 16A in that a bipolar transistor 90 includes a silicon nitride film 91 as a hydrogen barrier film. Although not shown, the Bi-CMOS device 97 includes a CMOSFET 34 having the same structure as the CMOSFET 34 in FIG. 16A. The silicon nitride film 91 is deposited to cover the substantially entire bipolar transistor 90 after a gate oxide film 44 is formed. Then, an insulating film 46, aluminum electrodes 47, and a passivation film 57, which is formed on the aluminum electrode 47 although not shown in FIG. 20. Therefore, the bipolar transistor 20 has relatively stable device characteristics.

Thirteenth Embodiment

Figure 21:
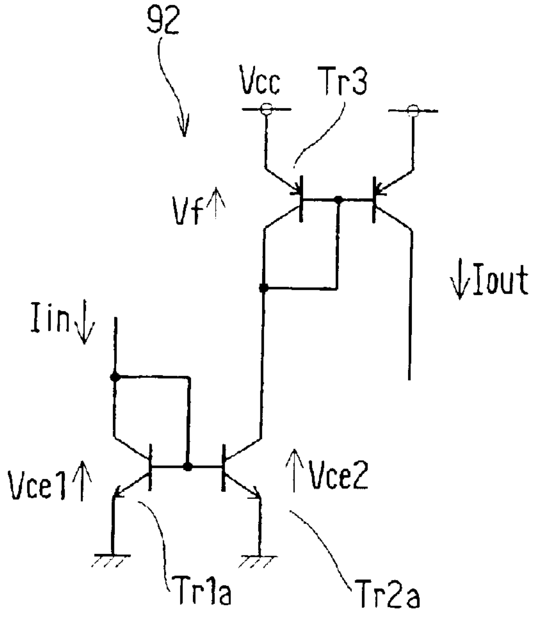
FIG. 21 is a circuit diagram according to a thirteenth embodiment.
Figure 22:
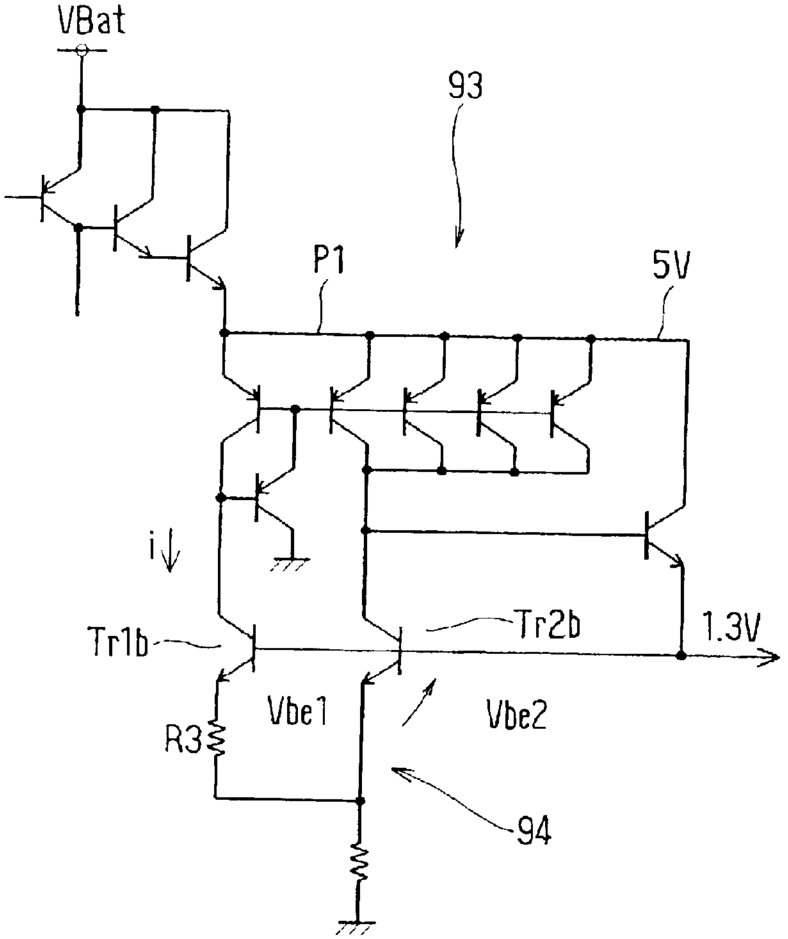
FIG. 22 is another circuit diagram according to the thirteenth embodiment.
Figure 23:
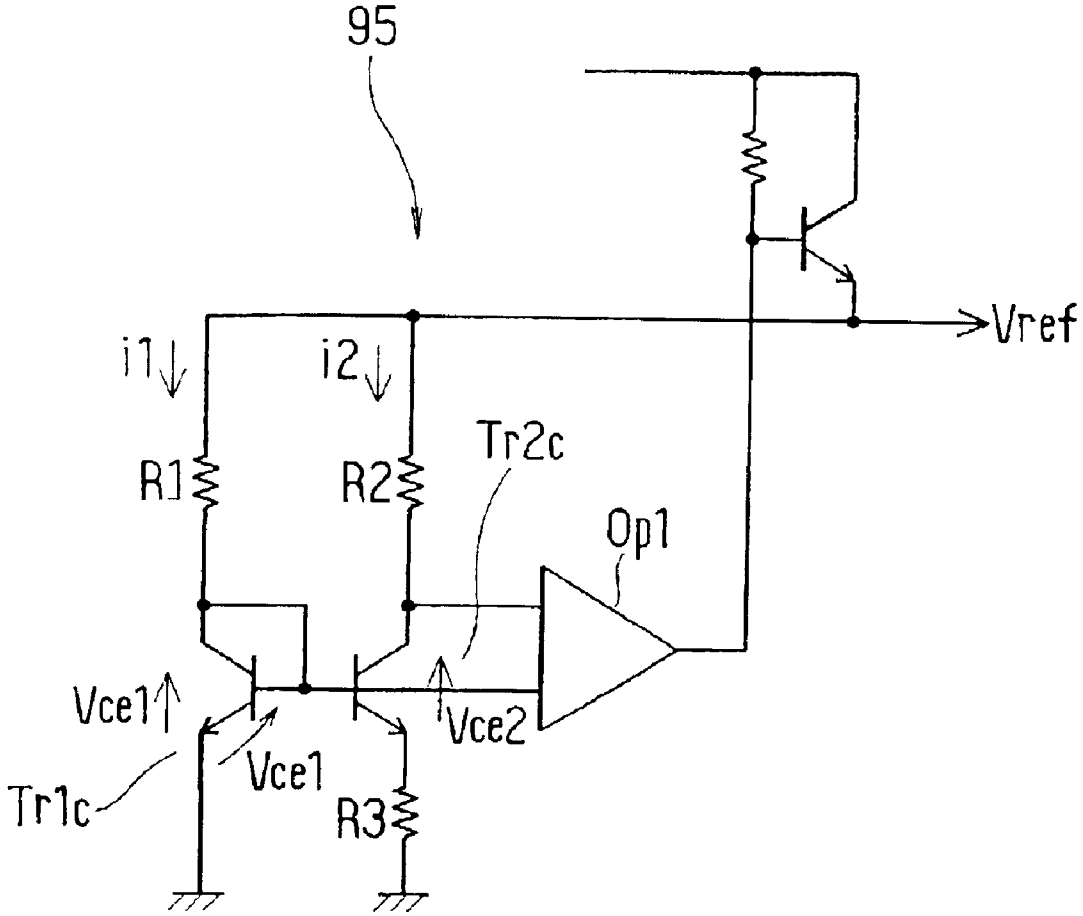
FIG. 23 is another circuit diagram according to the thirteenth embodiment.

As shown in FIGS. 21 to 23, each application circuit 92, 93, 95 includes a pair of npn transistors, which are bipolar transistors Tr1*a* and Tr2*a*, Tr1*b* and Tr2*b*, Tr1*c* and Tr2*c*. In each circuit 92, 93, 95, the bipolar transistors in the Bi-CMOS devices according to the first through twelfth embodiments are used as the pair of transistors Tr1*a* and Tr2*a*, Tr1*b* and Tr2*b*, Tr1*c* and Tr2*c* to ensure the performance parity between the pair in each circuits 92, 93, 95 and to achieve high performance.

In each circuit 92, 93, 95, the amount of shifts in transistor characteristics of the pair during operation differs from each other because each bipolar transistor is exposed to different biasing conditions during operation. Therefore, the balance in performance between the pair tends to be lost. Thus, all of the circuits 92, 93, 95 require that the bipolar transistors of the pair offer stable characteristics in spite of varying biasing conditions.

The first application circuit 92 of FIG. 24 is designed to provide an output current Iout in response to an input current Iin, and a current mirror circuit in the input stage of the first application circuit 92 includes the pair of bipolar transistors Tr1*a*, Tr2*a*, which have transistor characteristics identical with each other. The voltage Vce1 between the collector and the emitter of the transistor Tr1*a*, the collector and the base of which are shorted, is equivalent to the forward bias voltage Vf between the base and the emitter of a bipolar transistor Tr3. Furthermore, the voltage Vce2 between the collector and the emitter of the transistor Tr2*a* on the output side is equal to a balance between a supply voltage Vcc and the voltage Vf between the base and the emitter of the transistor Tr3.

Therefore, the voltages Vce1 and Vce2 are generally not equal to each other, and so are biasing conditions between the transistors Tr1*a*, Tr2*a*. When driven under such conditions, the shifts in device characteristics of the transistors Tr1*a*, Tr2*a*, which are used as a pair, becomes different from each other during operation and the performance parity between the transistors Tr1*a*, Tr2*a* to break down, if the bipolar transistor 5 in the proposed Bi-CMOSFET semiconductor device 1 of FIG. 24 is used for the pair of transistors Tr1*a*, Tr2*a*. On the other hand, stable circuit operation can be maintained in the circuit 92 of FIG. 21 by using the bipolar transistors in the Bi-CMOS devices according to the first through twelfth embodiments for the pair of transistors Tr1*a*, Tr2*a*.

The second application circuit 93 of FIG. 25 is a band gap circuit, which is used for outputting a reference voltage of, for example, 1.3 V. In the application circuit 93, currents of two different magnitudes are respectively provided for transistors Tr1*b*, Tr2*b* in a band gap circuit 94 of the second application circuit 93. The voltage drop due to a resistance R3, which is connected to the emitter of the transistor Tr1*b* and has an electric resistance of R3 ohms, leads to the following relationship between voltage Vbe1 and voltage Vbe2, which are respectively the voltage between the base and the emitter of the transistor Tr1*b* and the voltage between the base and the emitter of the transistor Tr2*b*:

$$Vbe2-Vbe1=R3\times i,$$

where i is a current that flows through the resistance R3.

Therefore, the transistors Tr1*b*, Tr2*b*, which are used in a pair, are driven under different conditions. Thus, stable circuit operation can be maintained in the circuit 93 of FIG. 22 by using the bipolar transistors in the Bi-CMOS devices according to the first through twelfth embodiments for the pair of transistors Tr1*b*, Tr2*b*.

The third application circuit 95 of FIG. 26 is also a band gap circuit, which is used for outputting a reference voltage Vref using a band gap circuit. In the application circuit 95, transistor Tr1*c*, Tr2*c*, which are used in a pair to make up the band gap circuit, operate under the following conditions, and a collector voltage and a base voltage of the transistor Tr2*c* are inputted into input terminals to an op amp Op1:

$Vbe1=Vce1=Vce2+R3\times i2$, and $i1/i2=R2/R3$.

Therefore, the transistors Tr1*c*, Tr2*c* are driven under different conditions. Thus, stable circuit operation can be maintained in the circuit 95 of FIG. 23 by using the bipolar transistors in the Bi-CMOS devices according to the first through twelfth embodiments for the pair of transistors Tr1*c*, Tr2*c*.

Other Embodiments

The present invention is not limited to the Bi-CMOS devices of the first through twelfth and can also apply to the following variations.

Each method used in the Bi-CMOS devices of the first through twelfth of the embodiments can be used alone or in combinations. That is to say, the first group of methods used in the first through fifth embodiments, in which the high impurity concentration p-type base region 50 is used, the second group of methods used in the sixth and the seventh embodiments, in which ultraviolet rays are exposed to the Bi-CMOS devices, and the third group of methods used in the eighth through the twelfth embodiments, in which the hydrogen barrier film is used, may be combined with each other in various arrangements.

Although the transistors are isolated from each other by the trenches 38 and the insulating layer 33 in the Bi-CMOS devices of the first through twelfth embodiments, the transistors may be isolated by PN junctions.

The polycrystalline silicon film 85, which is the hydrogen barrier film, is formed to surround the emitter region 49 in the Bi-CMOS device of FIG. 16A. However, if the emitter region 49 is formed to be in contact with the adjacent LOCOS 39 at one side of the emitter region 49, the polycrystalline silicon film may surround the emitter region 49 on the remaining three sides.

Although only one of the aluminum electrodes 47, which are the base electrode 47*a* and the emitter electrode 47*b*, extends out in the Bi-CMOS devices of FIGS. 18A and 19A, both the base electrode 47*a* and the emitter electrode 47*b* may extend out.

What is claimed is:

1. A method for manufacturing a semiconductor device that includes a CMOSFET and a bipolar transistor, wherein the bipolar transistor is formed on a substrate by forming a well region of the CMOSFET and pairs of regions of the CMOSFET, each pair of which includes a source region and a drain region, on the substrate, and wherein a high impurity concentration region is formed by introducing a first impurity of the same conductivity type as a base region of the bipolar transistor in a surface of the base region wherein an insulating film is formed on a surface of the base region, and wherein a hydrogen barrier film is formed on the insulating film to cover the surface of the base region.

2. The method in claim 1, wherein the hydrogen barrier film includes one film selected from the group that consists of a polycrystalline silicon film, an aluminum film, and a silicon nitride film.

3. The method in claim 1, wherein an SOI substrate is used for the substrate.

4. A method for manufacturing a semiconductor device, which includes a CMOSFET and a bipolar transistor, wherein the bipolar transistor is formed on a substrate using steps of forming a well region of the CMOSFET and pairs of regions of the CMOSFET, each pair of which includes a source region and a drain region, on the substrate, and wherein a surface of a base region, of the bipolar transistor is exposed to ultraviolet rays to reduce the amount of charges existing at an interface between the base region and an insulating film, which is located on the surface of the base region.

5. The method in claim 4, wherein an insulating film is formed on a surface of the base region, and wherein a hydrogen barrier film is formed on the insulating film to cover the surface of the base region.

6. The method in claim 5, wherein the hydrogen barrier film includes one film selected from the group that consists of a polycrystalline silicon film, an aluminum film, and a silicon nitride film.

7. A method for manufacturing a semiconductor devices, which includes a CMOSFET and a bipolar transistor, wherein the bipolar transistor is formed on a substrate using steps of fanning a well region of the CMOSFET and pairs of regions of the CMOSFET, each pair of which includes a source region and a drain region, on the substrate, and wherein an insulating film is formed on a surface of a base region of the bipolar transistor, and wherein a hydrogen barrier film is formed on the insulating film to cover the surface of the base region.

8. The method in claim 7, wherein the hydrogen barrier film includes one film selected from the group that consists of a polycrystalline silicon film, an aluminum film, and a silicon nitride film.

9. The method in claim 7, wherein the hydrogen barrier film is formed from a polycrystalline silicon film that is used for forming a gate electrode of the CMOSFET at a step of forming the gate electrode.

10. The method in claim 7, wherein an SOI substrate is used for the substrate.

11. A semiconductor device comprising a CMOSFET and a bipolar transistor, wherein the CMOSFET and the bipolar transistor are located on the same substrate, wherein a high impurity concentration region, which includes a impurity of the same conductivity type as a base region of the bipolar transistor with higher concentration than the base region, is located in a surface of the base region, wherein the distance between an emitter region of the bipolar transistor and the high impurity concentration region is 2 μm or shorter.

12. The semiconductor device in claim 11, wherein the distance is 1 μm or longer.

13. A semiconductor device comprising a CMOSFET and a bipolar transistor, wherein the CMOSFET and the bipolar transistor are located on the same substrate, wherein a hydrogen barrier film is located on a surface of the base region with an insulating film in-between.

14. The method in claim 13, wherein the hydrogen barrier film includes one film selected from the group that consists of a polycrystalline silicon film, an aluminum film, and a silicon nitride film.

15. The semiconductor device in claim 13, wherein the hydrogen barrier film is made of a polycrystalline silicon film, wherein a gate electrode of the CMOSFET is made of another polycrystalline silicon film, and wherein the polycrystalline silicon films are formed from a polycrystalline silicon film.

16. The semiconductor device in claim 13, wherein the substrate is an SOI substrate.

* * * * *